US007424069B1

(12) United States Patent
Nicholls et al.

(10) Patent No.: US 7,424,069 B1
(45) Date of Patent: Sep. 9, 2008

(54) REFERENCE TIMING SIGNAL APPARATUS AND METHOD

(75) Inventors: Charles Nicholls, Nepean (CA); Gregory Carleton, Ottawa (CA); Steve Beaudin, Nepean (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 785 days.

(21) Appl. No.: 10/921,323

(22) Filed: Aug. 19, 2004

(51) Int. Cl.
*H03D 1/00* (2006.01)
(52) U.S. Cl. .................................................. 375/339
(58) Field of Classification Search ................ 375/371, 375/376, 324; 331/10–11, 14, 17–18, 25, 331/44, 65–66; 455/255, 260
See application file for complete search history.

(56) References Cited

U.S. PATENT DOCUMENTS

| 4,305,045 | A | * | 12/1981 | Metz et al. ................... 331/1 A |
| 5,144,595 | A | | 9/1992 | Graham et al. |
| 5,697,082 | A | | 12/1997 | Greer et al. |
| 6,081,163 | A | | 6/2000 | Ujiie et al. |
| 6,194,970 | B1 | * | 2/2001 | Nielsen et al. ................ 331/16 |
| 6,711,230 | B1 | | 3/2004 | Nicholls et al. |
| 7,015,762 | B1 | * | 3/2006 | Nicholls et al. ............... 331/10 |
| 2003/0185331 | A1 | * | 10/2003 | Agizim et al. .............. 375/376 |
| 2004/0179642 | A1 | * | 9/2004 | Fontaine et al. ............. 375/376 |
| 2006/0038622 | A1 | * | 2/2006 | Choe et al. .................... 331/74 |

FOREIGN PATENT DOCUMENTS

EP 0615360 9/1994

OTHER PUBLICATIONS

Penrod, "Adaptive Temperature Compensation of GPS Disciplined Quartz and Rubidium Oscillations", *IEEE International Frequency Control Symposium*, 1996, pp. 980-987.

* cited by examiner

*Primary Examiner*—Khanh C Tran
(74) *Attorney, Agent, or Firm*—Jeffrey M. Measures; Borden Ladner Gervais LLP

(57) ABSTRACT

A reference timing signal apparatus with a phase-locked loop has a computer algorithm which adaptively models the multiple frequencies of an oscillator following a training period. The oscillation frequency of the oscillator is controlled in response to a phase detector output. The computer algorithm processes the control signal applied to the oscillator. The computer algorithm updates the characteristics of the model relating to the aging and temperature of the oscillator, using for example, a Kalman filter as an adaptive filter. By the algorithm, the subsequent model predicts the future frequency state of the oscillator on which it was trained. The predicted frequency of the model functions as a reference to correct the frequency of the oscillator in the event that no input reference timing signal is available. In a case of using pre-processing infinite impulse response filters (IIRFs) before the adaptive processor, the time delay caused by the filters are compensated after the adaptive processor. Without pre-processing IIRFs, aging and temperature update rates are adaptively controlled by dynamically changing the rates depending upon the loop condition to achieve a wider tracking bandwidth. With the model updating algorithm, oscillators of low stability performance may be used as cellular base station reference oscillator.

38 Claims, 22 Drawing Sheets

REFERENCE TIMING SIGNAL APPARATUS AND METHOD

FIELD OF THE INVENTION

The present invention relates to a reference timing signal apparatus and method for providing a timing output signal. The reference timing signal apparatus is applicable to a cellular telephone base station, for example. The present invention is also applicable to reference signal or clock signal generators in other types of apparatus, for example, optical transport networks.

BACKGROUND OF THE INVENTION

A known cellular telephone system is a Code Division Multiple Access (CDMA) system. The CDMA wireless phone system allows multiple cellular phone users to share the same frequency spectrum, and uses a generated noise carrier with a different and essentially orthogonal instance of the noise carrier assigned to each mobile unit within a cell. The base station receiver in a CDMA station correlates the received signal from a mobile unit with the desired noise carrier, extracting the transmitted digital signal with a sufficient signal-to-noise ratio to achieve a satisfactory data error rate. Because the base stations in a system such as CDMA must be synchronized with surrounding base stations to handle handoff of mobile phones between cells and for other functions, a time reference must be provided to each base station. This is commonly provided via Global Positioning System (GPS) receivers which comprise a part of each base station.

GPS satellites each provide radio signals that are synchronized and usable by GPS receivers not only to derive one's physical position relative to the satellites but also to derive a very accurate time reference. Because the GPS receiver antennas of cellular phone equipment are often placed high relative to surrounding terrain, they are subject to lightning damage in addition to physical damage from rough handling or other damage. CDMA base stations which lose contact with GPS satellites should ideally continue to operate during this holdover period until contact can be reestablished, whether through repair of damaged equipment, or other changed circumstances. A crystal oscillator may provide a time reference during this holdover period, as long as the oscillator is stable enough to keep the base station sufficiently synchronized with other base stations.

A method is needed for improving on the performance of current CDMA base station clock stability when the base station is not receiving a GPS signal to provide a clock reference. When no GPS signal is received the system clock operates in holdover mode, and the clock signal is generated by a crystal oscillator designed to provide a signal of the same frequency as is provided by the GPS receiver. It is necessary to improve current GPS-based clock stability during holdover by compensating for the performance of a crystal used to generate a clock signal during this holdover period.

A typical CDMA base station uses a received GPS signal to produce a reference clock signal to ensure that CDMA stations are synchronized in operation. Such synchronization between stations is important to the proper operation of a CDMA system, as common operations such as a CDMA spread spectrum code search and station-to-station handoff require that stations be closely synchronized in time. Mobile stations also synchronize to the signals provided by the base station, such that the GPS clock provides a timing reference for both the base station and all mobile stations active within the cell.

This synchronization is jeopardized when the base station fails to receive a GPS signal, and must rely on an oscillator to maintain time independent of the GPS signal still used by neighboring base stations. This commonly occurs as a result of lightning strikes that damage the GPS antenna or receiver of a CDMA system, and also occurs as a result of damage due to rough handling and vandalism or from other causes. If the oscillator is not sufficiently stable, the time it provides to the base station may drift with respect to the desired GPS reference time, and cause the base station to fail to communicate properly.

Currently, a new oven-controlled crystal oscillator (OCXO) used to provide a holdover clock signal in a CDMA system is burned in and tested in operation for frequency stability for no more than a few days. Crystals that perform adequately are then accepted for service and placed in use as part of a CDMA base station. But, because crystals often take from 20 to 30 days to settle in or become stable in performance, this test cannot ensure performance of the crystal in extended operation.

Excessive frequency drift due to molecular settling or spurious frequency jumps due to contaminants in the crystal may cause the crystal to perform much more poorly in the field than these preliminary tests could indicate. Other factors such as rough handling during installation or spurious mechanical changes in the crystal may further degrade crystal stability, and are not detectable after initial testing. In order to reduce base station cost, lower cost reference oscillator may be used. However, in general, the frequency stability of low cost OCXOs is poor and thus, the frequency stability in the holdover period is not reliable. It must be ensured that the increased frequency drift in the low cost OCXOs used as base station reference oscillators is compensated sufficiently to maintain the required level of base station synchronization.

A clock synchronizing circuit including a phase lock circuit with a voltage controlled oscillator (VCO) and a temperature compensation circuit is disclosed in European Patent Publication No. 0 615 360 A2 (Sep. 14, 1994). A frequency standard generator including a voltage controlled crystal oscillator (VCXO) that is phase locked to a GPS satellite time signal is disclosed in U.S. Pat. No. 6,081,163 issued to Ujiie et al. on Jun. 27, 2000. Bruce M. Penrod "Adaptive Temperature Compensation of GPS Disciplined Quartz and Rubidium Oscillators", 1996 IEEE International Frequency Control Symposium, pp. 980-987, discloses that an algorithm for performing adaptive temperature and aging compensation of GPS disciplined oscillators.

U.S. Pat. No. 6,194,970 issued to Nielsen et al. on Feb. 27, 2001 discloses an oscillator stability monitoring and compensation system for analyzing the steering voltage applied to a crystal oscillator over time and compensating for spurious frequency jumps in determining the drift rate of a crystal oscillator. The steering voltage is used to estimate oscillator stability by comparing a projected steering voltage against an actual voltage after a simulated holdover period, or analyzing a steering voltage recorded over a period of time and evaluating rates of change. Spurious frequency jumps are removed from data collected while not in an actual holdover, making the data more accurately represent the frequency drift rate of the oscillator. The rate of occurrence of spurious frequency jumps while not in holdover may be monitored to provide information regarding the physical condition of the crystal. However, the system is directed to detect spurious frequency jumps in the crystal and compensate for these jumps in character of the performance of the crystal. It does not address the problem of a low performance reference oscillator.

U.S. Pat. No. 5,697,082 issued to Greer et al. on Dec. 9, 1997 discloses a self-calibrating frequency standard system self-calibrating a clock of a communication terminal for use with communication systems in which a central communication node generates time base correction signals for the terminal clock. Included is a terminal oscillator which generates an oscillator frequency that includes an error amount. An oscillator calibration filter generates a frequency error estimate amount. The frequency error estimate amount generated by the calibration filter is subtracted from the oscillator frequency error amount. The time base correction signals are applied to the calibration filter to thereby modify the frequency error estimate amount generated by the calibration filter based upon the time base correction signals generated by the communication central node. It does not address the problem of low performance reference oscillator, either.

For example, in the North American synchronous CDMA, it is required to meet with all reference oscillator specifications with respect to the accumulated timing error over the holdover period. An example of specification for a compact base transceiver system (BTS) is 6.9 microseconds cumulative timing error in 24 hours, which translates to a frequency stability requirement of 0.08 parts per billion on the 10 MHz reference oscillator. It is noted that the holdover specifications include all operating condition variations, the most severe of which from a crystal oscillator design standpoint, is the −5 Celsius to +70 Celsius ambient temperature range.

The simplest approach to the problem of determining the oscillator frequency when a more stable reference is unavailable is to avoid the requirement for doing so altogether. In order not to have to know the oscillator frequency during the holdover period, the problem is that one of ensuring the cumulative time error of the free running oscillator remains within the specified 6.9 microseconds. To achieve the required level of stability directly from the oscillator without recourse to any form of control loop places severe demands on the crystal cut and thermal stabilization through the use of double oven architectures. It is, thus, required to improve the oscillator long term stability with low cost. For example, rubidium oscillators and conventional double oven crystal oscillators are still expensive.

SUMMARY OF THE INVENTION

It is an object of the present invention to provide an improved reference timing signal apparatus and method for providing a timing output signal.

The present invention is directed to a reference timing signal apparatus for providing a timing output signal, in one aspect. The reference timing signal apparatus comprises an oscillator for generating an oscillation output signal in response to a control component of an input control signal. The oscillator has aging and temperature characteristics resulting in variation in oscillation frequency. A difference detector detects a difference between the oscillation output signal and an input reference timing signal when the input reference timing signal is available. A difference signal is provided. A processor varies the control component of the input control signal applied to the oscillator in accordance with the difference detected by the difference detector and a frequency dependent element relating to the oscillator. The frequency dependent element is provided in accordance with a characteristic model that is updateable in accordance with the difference signal provided by the difference detector when the input reference timing signal is available.

Advantageously, in the reference timing signal apparatus, a frequency of the oscillation output signal generated by the oscillator is controlled in accordance with the varied control component of the input control signal.

For example, the processor includes: a first pre-processing filter for filtering the difference signal to provide a first filtered output signal; a first processing unit for updating a first parameter of a first characteristic model relating to the aging characteristic of the oscillator in response to the first filtered output signal; a second pre-processing filter for filtering a combined input signal of the difference signal and the first filtered output signal to provide a second filtered output signal; a second processing unit for updating a second parameter of a second characteristic mode relating to the temperature characteristic of the oscillator in response to the second filtered output signal, thereby providing a second processed output signal; and a signal combining unit for combining the first and second processed output signals to provide a combined processed signal.

The reference timing signal apparatus further comprises a difference processing unit for causing the difference to be offset before being applied to the processor and for compensating the offset of the processor output.

For example, in a case where the reference timing signal apparatus is used in a cellular base station, the input reference timing signal is available from a cellular receiver when it is locked and the input reference signal is unavailable when signal receiving is interrupted, that is, a holdover period. The input reference timing signal is derived from a satellite system.

Advantageously the first processing unit updates the first parameter in accordance with the detected difference, when the input reference timing signal is available. The first processing unit updates the first parameter in accordance with its past or preceding parameter, when the input reference timing signal is unavailable. The second processing unit updates the second parameter in accordance with the difference signal, the first characteristic provided by the first processing unit and a temperature in relation to the oscillator, when the input reference timing signal is available. The second processing unit updates the second parameter in accordance with its past or preceding parameter, when the input reference timing signal is unavailable. The first and second characteristics are combined to produce the characteristic signal to vary the frequency of the oscillation output signal of the oscillator. Since the first and second parameter relates to frequency dependent elements on the frequency of the oscillator, with adaptively updating of the characteristic model, the frequency change to the oscillation signal over time is compensated.

The reference timing signal apparatus may include a calculator for calculating cumulative time error (CTE) in response to the difference signal. Error data corresponding to the calculated CTE may be applied to the processor. The application of the error data to the processor may be delayed for a predetermined time period.

Advantageously, the error data is offset by its initial data before being applied to the processor and compensated for the offset for an aging model calculation.

In the reference timing signal apparatus, the compensation unit compensates the time delay resulted from the pre-processing filters and thus, the tracking of the reference timing signal apparatus is improved.

In a case where the reference timing signal apparatus is applied to a base station, for example, it improves current GPS-based clock stability during holdover by better estimating and compensating for the performance of a crystal used to generate a clock signal during the holdover period. Also, it improves the clock stability during holdover based in other satellite systems, e.g., GLONASS and Galileo.

The reference timing signal apparatus may include a temperature sensor for sensing temperature in relation to the oscillator to provide a temperature signal to the second processing unit for updating the second parameter. The second processing unit may include an update distinction detector for detecting a distinction of the second parameter in accordance with the frequency of the oscillation output signal and the temperature in relation to the oscillator. The second parameter is positively or negatively updated in accordance with the detected distinction. Also, the second processing unit may include a voltage detector for detecting voltage in relation to the oscillator to provide a voltage signal to the second processing unit, the second processing unit updating the second parameter in accordance with the correction data, the first characteristic signal, the temperature and the voltage, when the input reference timing signal is available.

Advantageously, the reference timing signal apparatus may include a controller for delaying the training of the processor and for controlling the training of the processor. After the reference timing signal apparatus is phase-locked, under control by the training controller, the processor is trained for a training period, provided applicability of the input reference timing signal.

In an example, the calculated CTE or the correction data (or value) is stored and the stored data is updated when the most recently data is provided by the error calculator. The stored data is unchanged during satellite holdover period. Then, the stored error or data is used while no input reference timing signal or accurate predicted frequency value from the processor is available.

According to another aspect of the present invention, there is provided a method for providing a timing output signal. The method comprises the steps of: generating an oscillation output signal in response to a control component of an input control signal, the oscillation frequency being varied resulting from aging and temperature characteristics; detecting a difference between the oscillation output signal and an input reference timing signal when the input reference timing signal is available, thereby providing a difference signal; changing the control component of the input control signal applied to the oscillator in accordance with the difference signal and a frequency dependent element relating to the oscillator; providing the frequency dependent element in accordance with first and second characteristic models relating to the aging and temperature characteristics, respectively; filtering the difference signal to provide a first pre-processing filtered signal; filtering a combined signal of the difference signal and the first pre-processing filtered signal to provide a second pre-processing filtered signal; updating the first and second characteristic models in accordance with the first and second pre-processing filtered signals, respectively, when the input reference timing signal is available; producing a processed output signal in accordance with the updated first and second characteristic models; and compensating a time delay in the processed output signal resulting from the filtering, thereby producing the input control signal.

Advantageously, in the method, a frequency of the oscillation output signal generated by the oscillator is controlled in accordance with the varied control component of the input control signal, the timing output signal being provided in accordance with the oscillation output signal. By the method, the timing output signal is provided when the input reference timing signal is unavailable.

For example, the characteristic model is adaptively updated in accordance with aging and temperature characteristics relating to the oscillator. Since the first and second parameters of the model relate to frequency dependent elements on the frequency of the oscillator, with adaptively updating of the characteristic model and the parameters, the frequency change to the oscillation signal over time is compensated.

In accordance with a further aspect of the present invention, there is provided a reference timing signal apparatus for providing a timing output signal. The reference timing signal apparatus comprises: an oscillator for generating an oscillation output signal in response to a control component of an input control signal; a difference detector for detecting a difference between the oscillation output signal and an input reference timing signal when the input reference timing signal is available, thereby providing a difference signal; a processor for varying the control component of the input control signal applied to the oscillator in accordance with the difference detected by the difference detector and a frequency dependent element relating to the oscillator, the frequency dependent element being provided in accordance with a characteristic model that is updateable in accordance with the difference signal provided by the difference detector when the input reference timing signal is available.

Advantageously, a frequency of the oscillation output signal generated by the oscillator is controlled in accordance with the varied control component of the input control signal.

The reference timing signal apparatus also comprises a controller for controlling a tracking bandwidth of the processor so as to adaptively change the tracking bandwidth in accordance with a loop condition of the apparatus.

In the reference timing signal apparatus, no pre-processing filters are used and thus, no time delay compensation is necessary. Also, the updating of the model characteristics is dynamically and adaptively changed and thus, the reference timing signal apparatus's tracking is improved.

In accordance with yet a further aspect of the present invention, there is provided a method for providing a timing output signal. The method comprises the steps of: generating an oscillation output signal in response to a control component of an input control signal; detecting a difference between the oscillation output signal and an input reference timing signal when the input reference timing signal is available, thereby providing a difference signal; changing the control component of the input control signal in accordance with the detected difference and a frequency dependent element relating to the generation; providing the frequency dependent element in accordance with a characteristic model that is updateable in accordance with the difference signal when the input reference timing signal is available; and adaptively changing a tracking bandwidth for updating the characteristic model.

Advantageously, in the method, a frequency of the oscillation output signal is controlled in accordance with the varied control component of the input control signal, the timing output signal being provided in accordance with the oscillation output signal. By the method, the timing output signal is provided when an input reference timing signal is unavailable.

In accordance with yet a further aspect of the present invention, there is provided an apparatus for generating a reference signal for use in a cellular base station. The apparatus comprises: a receiver for generating an input reference timing signal when a cellular signal is available; an oscillator for generating an oscillation output signal in response to a control component of an input control signal; a difference detector for detecting a difference between the oscillation output signal and the input reference timing signal when the input reference timing signal is generated, thereby providing a difference signal; a processor for varying the control component of the input control signal applied to the oscillator in accordance with the difference detected by the difference detector and a frequency dependent element relating to the oscillator, the frequency dependent element being provided in accordance with a characteristic model that is updateable in accordance with the difference signal provided by the difference detector when the input reference timing signal is generated.

Advantageously, in the apparatus, a frequency of the oscillation output signal generated by the oscillator being controlled in accordance with the varied control component of the input control signal.

The apparatus also comprises a controller for controlling a tracking bandwidth of the processor so as to adaptively change the tracking bandwidth in accordance with a loop condition of the apparatus.

The model updating may be performed by a computer algorithm. With such model updating, oscillators of low stability performance may be used as cellular base station reference oscillators, because high frequency stability is achieved. In order to update the characteristic model, adaptive algorithm may be used. For example, an adaptive filter is used for the adaptive algorithm.

BRIEF DESCRIPTION OF THE DRAWINGS

Examples of the present invention will now be described in relation to the accompanying drawings in which.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined only by the appended claims.

The present invention is applicable to a computer algorithm which adaptively models the multiple frequency dependent characteristics in relation to an oscillator following a "training period". The subsequent model predicts the future frequency state of the oscillator on which it was trained. The predicted frequency of the model functions as a reference to correct the oscillator frequency in the event that no other stable correction signal is available. The algorithm may be implemented in firmware. The computer algorithm may be provided with an adaptive filter.

Figure 1:
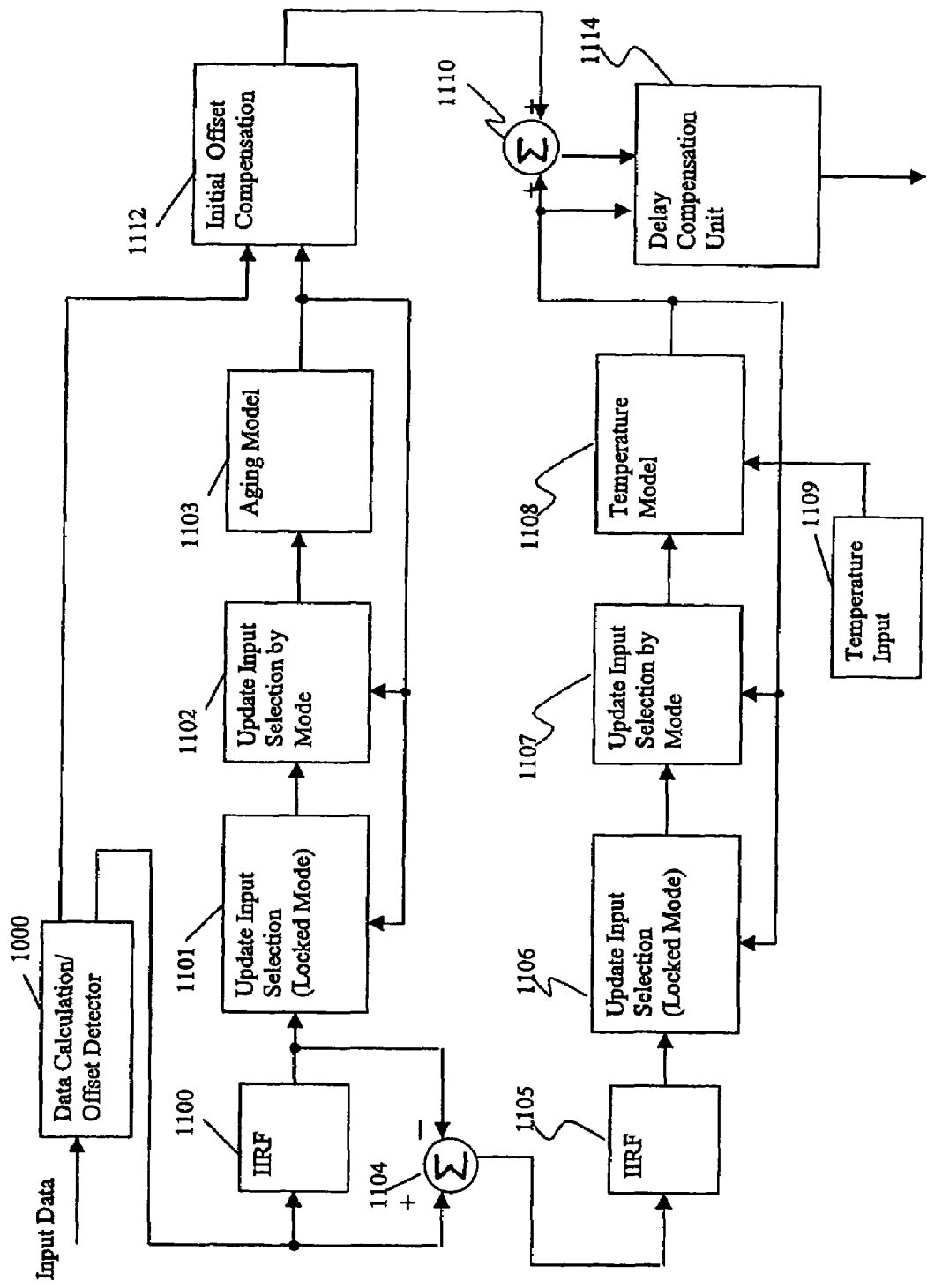
FIG. 1 illustrates the function of blocks of one embodiment according to the present invention.

FIG. 1 illustrates the function implemented in one embodiment according to the present invention which provides a clock signal in a CDMA base station (not shown). There are two operating modes: GPS locked mode and holdover mode. Referring to FIG. 1, input data of a control loop phase difference for the reference oscillator (not shown) is fed to a correction calculator/offset detector 1000 that produces correction data and initial offset data. The correction data is fed to an infinite impulse response filter (IIRF) 1100 which in turn provides its IIRF filtered output data to a locked-mode input selector 1101.

The locked-mode input selector 1101 selects update input data and its selected data is fed to a GPS-holdover input selector 1102 which provides data selected in accordance with a mode to an aging model calculator 1103. In the GPS locked mode, the data selected by the locked-mode input selector 1101 is fed to the aging model calculator 1103. The aging model calculator 1103 calculates Kalman filter function values in accordance with the input data and updates an aging model thereof, so that the future frequency state of the oscillator is predicted from the updated model. The aging model relates to the aging characteristic of the oscillator.

In accordance with the updated model, output data is fed from the output of the aging model calculator 1103 through to the locked-mode input selector 1101 and the GPS-holdover input selector 1102. In the event that the aging model needs to be periodically updated by its preceding state, the locked-mode input selector 1101 selects the output data of the aging model calculator 1103 as input data, so that the output data is fed back to the input of the aging model calculator 1103. Accordingly, the aging model is updated by the preceding state. In the holdover mode, the input data is unavailable and the GPS-holdover input selector 1102 selects the output data of the aging model calculator 1103 and feeds it back to the input thereof, so that the aging model of the aging model calculator 1103 is updated in accordance with its preceding state in the holdover period.

The output data from the aging model calculator 1103 is fed to an initial offset compensation unit 1112 that receives the initial offset data from the correction calculator/offset detector 1000 so as to recover the initial step offset associated with the data input to the IIRF 1100. The initial data is held in the correction calculator/offset detector 1000 and subtracted data is fed to the IIRF 1100 and thus, a large step transient to the IIRF 1100 is avoided.

The correction data from the correction calculator/offset detector 1000 is subtracted by the output data of the IIRF filtered output data from the IIRF 1100 in a subtractor 1104 and the subtracted data is fed to another IIRF 1105. The IIRF filtered output data of the IIRF 1105 is fed to a locked-mode input selector 1106. The locked-mode input selector 1106 selects update input data and its selected data is fed to a GPS-holdover input selector 1107 which provides selected data, in accordance with a mode, to a temperature model calculator 1108.

In the GPS locked mode, the data selected by the locked-mode input selector 1106 is fed to the temperature model calculator 1108. Also, a temperature sensor 1109 provides the temperature model calculator 1108 with temperature input data that relates to the oscillator. The temperature model calculator 1108 calculates Kalman filter function values in accordance with the input data and updates a temperature model thereof, so that the future frequency state of the oscillator is predicted from the updated model. The temperature model relates to the temperature characteristic of the oscillator. In accordance with the updated model, output data is fed from the output of the temperature model calculator 1108 to the locked-mode input selector 1106 and the GPS-holdover input selector 1107.

In the event that the temperature model needs to be periodically updated by its preceding state, the locked-mode input selector 1106 selects the output data of the temperature model calculator 1108 as input data, so that the output data is fed back to the input of the temperature model calculator 1108. The temperature model is updated by the preceding state. In the holdover mode, the input data is unavailable and the GPS-holdover input selector 1107 selects the output data of the temperature model calculator 1108 and feeds it back to the input thereof, so that the temperature model of the temperature model calculator 1108 is updated in accordance with the preceding state in the holdover period.

The aging model calculator 1103 and the temperature model calculator 1108 update their models adaptively. Such update function is achieved by adaptive algorithm. The Kalman filters are used to perform the adaptive algorithm function, as exampled, in the embodiment.

The output data of the aging model calculator 1103 is fed to the initial offset compensation unit 1112 that receives the initial offset data. After the output data is offset compensated or de-offset, it is fed to an adder 1110. Also, the output data of the temperature model calculator 1108 is fed to a delay compensation unit 1114 and the adder 1110 that provides added data. The added data contains time delay caused by the IIRF 1105. The time delay in the added data is compensated by a delay compensation unit 1114. The delayed data from the delay compensation unit 1114 represents a predicted frequency dependent element in accordance with the aging and temperature characteristics. The predicted frequency element is provided to the oscillator, so that the oscillator changes its oscillation frequency in accordance with the predicted frequency element, regardless of the GPS locked mode or the holdover mode. Therefore, the oscillation frequency is controlled in accordance with the models' elements updated by input data in the GPS-mode (a training period) and with the models' elements in the holdover mode, the elements having been updated in the training period.

Figure 2:
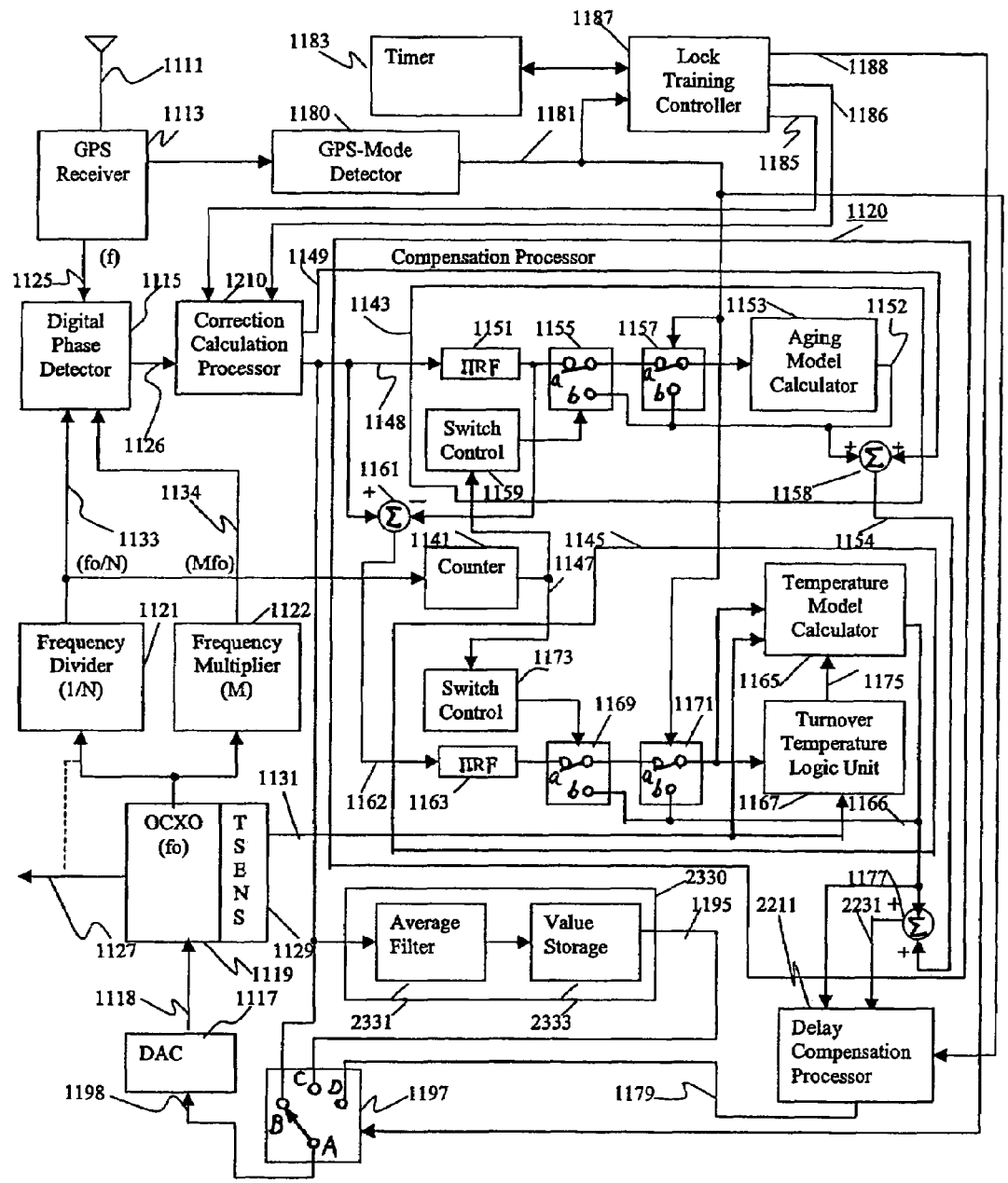
FIG. 2 is a block diagram of a reference timing signal apparatus used in a CDMA base station according to one embodiment of the present invention.

FIG. 2 shows a reference timing signal apparatus according to one embodiment of the present invention. The reference timing signal apparatus includes a phase-locked loop (PLL) which provides a clock signal in a CDMA base station, for example. The function of each block or unit shown in FIG. 2 corresponds to that of each of blocks shown in FIG. 1.

In FIG. 2, an antenna 1111 is connected to a GPS receiver 1113 that is connected to a PLL. The PLL includes a digital phase detector 1115, a digital-to-analog converter (DAC) 1117, an oven-controlled crystal oscillator (OCXO) 1119 and a frequency divider 1121. The reference timing signal apparatus includes a compensation processor 1120 for compensating frequency drift over time. A satellite-mode (GPS-mode) detector 1180 connected to the GPS receiver 1113 detects a GPS locked mode and a holdover mode thereof and supplies a mode-switching signal 1181 in accordance with the detected mode.

The mode-switching signal 1181 is fed to a lock training controller 1187 that is associated with a timer 1183. The lock training controller 1187 provides an initial control signal 1185, a training initiation signal 1186 and a DAC value selection signal 1188 in response to the mode-switching signal 1181 and the time of the timer 1183. The initial control signal 1185 and the training initiation signal 1186 are fed to a correction calculation processor 1210. The DAC value selection signal 1188 is fed to a DAC value selection switch 1197.

In normal operation (the GPS locked mode), an input reference timing signal 1125 (GPS-generated timing signal) is available from the GPS receiver 1113 and the OCXO 1119 is locked with the input reference timing signal 1125. A base station reference timing signal 1127 is provided by the reference timing signal apparatus (the OCXO 1119 included in the PLL). In the normal operation, in response to the input reference timing signal 1125, the PLL closely tracks the GPS-generated timing signal. During the holdover period (i.e., in the event that the input reference timing signal 1125 is unavailable), the base station reference timing signal 1127 is provided by the OCXO 1119 that had been phase-locked and is self-oscillated. The OCXO 1119 has a temperature sensor (TSENS) 1129 which provides a temperature signal 1131 representing sensed temperature in relation to the OCXO 1119. The compensation processor 1120 compensates frequency drift of the OCXO 1119 over time and in response to the temperature signal 1131.

The digital phase detector 1115 detects the difference in phase between the input reference timing signal 1125 (the GPS-generated timing signal) and the base station reference timing signal 1127 provided by the OCXO 1119 (or a frequency divided signal 1133 from the frequency divider 1121). A phase detection signal 1126 from the digital phase detector 1115 through the correction calculation processor 1210 is filtered and processed by the compensation processor 1120 which operates as a filter in the locked mode.

A delay compensation processor 2211 receives the mode-switching signal 1181 from the satellite-mode detector 1180. The aging processor output signal 1154 and the temperature model output signal 1166 are fed to an adder 1177, the output of which, a compensation processor output signal 2231, is fed to the delay compensation processor 2211 that receives the temperature model output signal 1166. A compensation processed signal 1179 from the delay compensation processor 2211 is fed to the DAC value selection switch 1197 (terminal "D"). The DAC value selection switch 1197 selects a calculated correction signal 1148, the compensation processed signal 1179 or a stored value signal 1195, in response to the DAC value selection signal 1188. A selected value signal 1198 from the DAC value selection switch 1197 is fed to the DAC 1117.

The DAC 1117 provides the OCXO 1119 with an electronic frequency control (EFC) input signal 1118. The EFC input signal 1118 has an analog steering voltage as a control component applied to the OCXO 1119 to vary the oscillation frequency. The OCXO 1119 produces the base station reference timing signal 1127 having a frequency fo which is fed to the frequency divider 1121 having a division factor N (e.g., 1). The frequency divided signal 1133 having a frequency of fo/N is fed to the digital phase detector 1115.

The OCXO 1119 also feeds a frequency multiplier 1122 having a multiplication factor M (e.g., 16). The frequency multiplier 1122 produces a frequency multiplied signal 1134 having a frequency foxM which is fed to the digital phase detector 1115. The phase detector 1115 includes a counter (not shown) that operates to count the number of cycles of the foxM frequency. The counter is initiated by the rising edge of the frequency divided signal 1133 and stopped by the rising edge of the reference signal 1125. The number of cycles of the foxM frequency thus represents the time difference between the reference and oscillator signals.

The correction calculation processor 1210 receives the phase detection signal 1126 from the digital phase detector 1115. The correction calculation processor 1210 provides the calculated correction signal 1148 and an initial value signal 1149. The calculated correction signal 1148 is fed to the compensation processor 1120, the correction value memory 2330 and the DAC value selection switch 1197 (terminal "B"). The correction value memory 2330 includes an average filter 2331 and a value storage 2333 and produces the stored value signal 1195 that is fed to the DAC value selection switch 1197 (terminal "C"). The average filter 2331 calculates a 50 point moving average of the calculated correction signal 1148 and the result of the averaging process in the variable is stored in the value storage 2333. The correction value store variable represents an average of the most recent 50 correction values, for example, and is used to steer the OCXO 1119 in the event that holdover is entered prior to the compensation processor 1120 being fully trained.

Calculation of the time difference between the reference signal 1125 and the frequency divided signal 1133 is conducted by multiplication of the number of counted cycles of the foxM signal by the signal period. For example, fo is 10 MHz and M is set at 16 leading to the time resolution of the digital phase detector of 6.25 ns.

The phase detection signal 1126 is fed to the correction calculation processor 1210 to adjust the output voltage applied to the OCXO 1119 through the DAC 1117, so that the phase difference between the input reference timing signal 1125 and the frequency divided signal 1133 is minimized. This PLL-based feedback circuitry therefore steers the frequency of the OCXO 1119 to provide the base station reference timing signal 1127 having a frequency of fo (=Nf), f being the frequency of the input reference timing signal 1125. The base station reference timing signal 1127 may be obtained from the frequency divider 1121, the frequency of which is fo/N.

Figure 3:
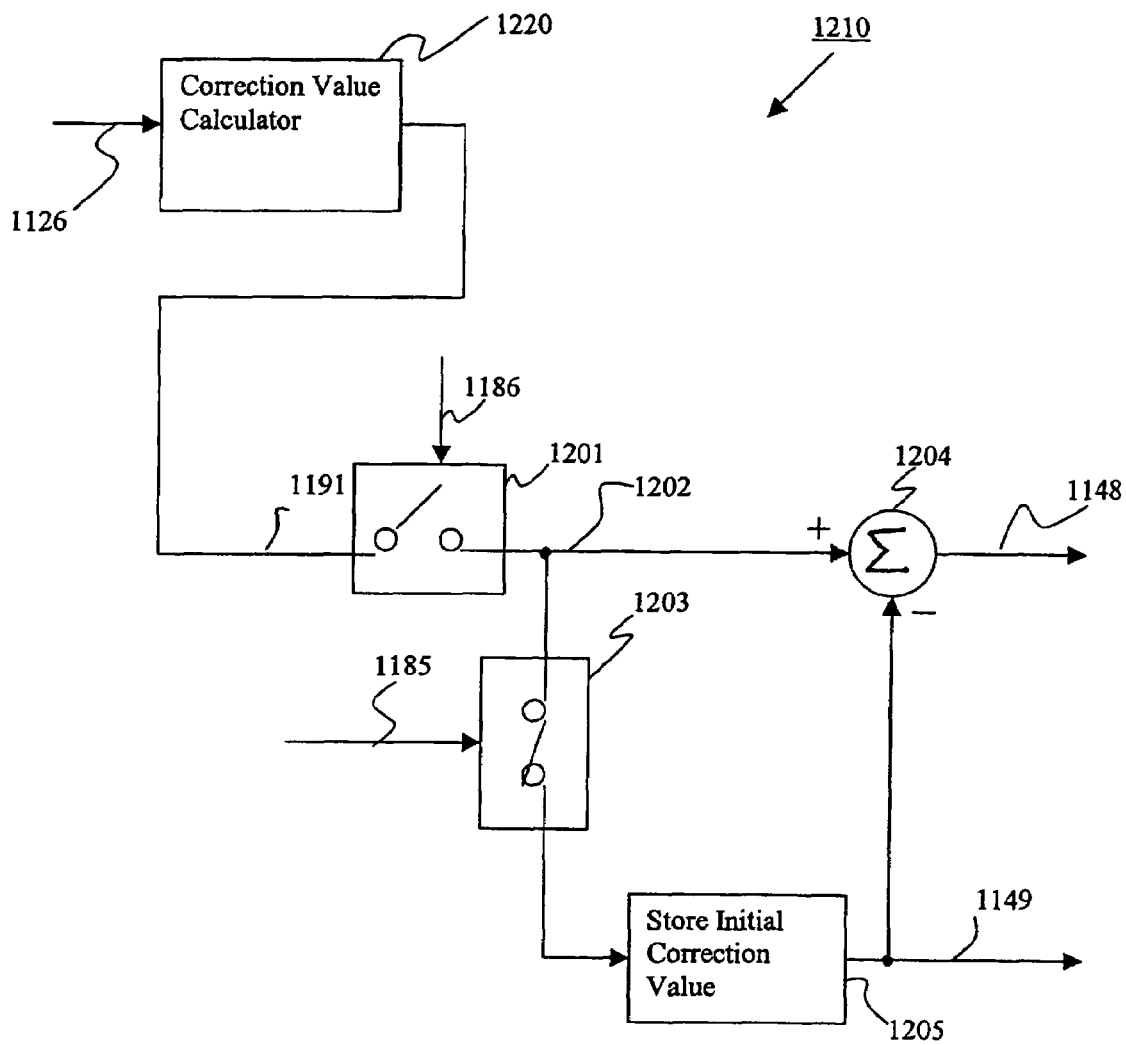
FIG. 3 is a detailed block diagram of a correction calculation processor shown in FIG. 2.

FIG. 3 shows a detail of the correction calculation processor 1210. Referring to FIGS. 2 and 3, the phase detection signal 1126 is fed to a correction value calculator 1220 for correction value calculation. A correction value signal 1191 from the correction value calculator 1220 is fed to a delay switch 1201 which is controlled by the training initiation signal 1186 from the lock training controller 1187. A correction input signal 1202 from the delay switch 1201 is fed to a subtractor 1204 and an initial switch 1203 that is controlled by the initial control signal 1185 from the lock training controller 1187. The correction value fed to the correction initial value storage 1205 through the delay switch 1201 and the initial switch 1203 is stored therein. The initial value signal 1149 representing the correction value held in the correction initial value storage 1205 is fed to the subtractor 1204 that provides the calculated correction signal 1148 having data of a subtraction of the correction value by the held correction value.

Figure 4:
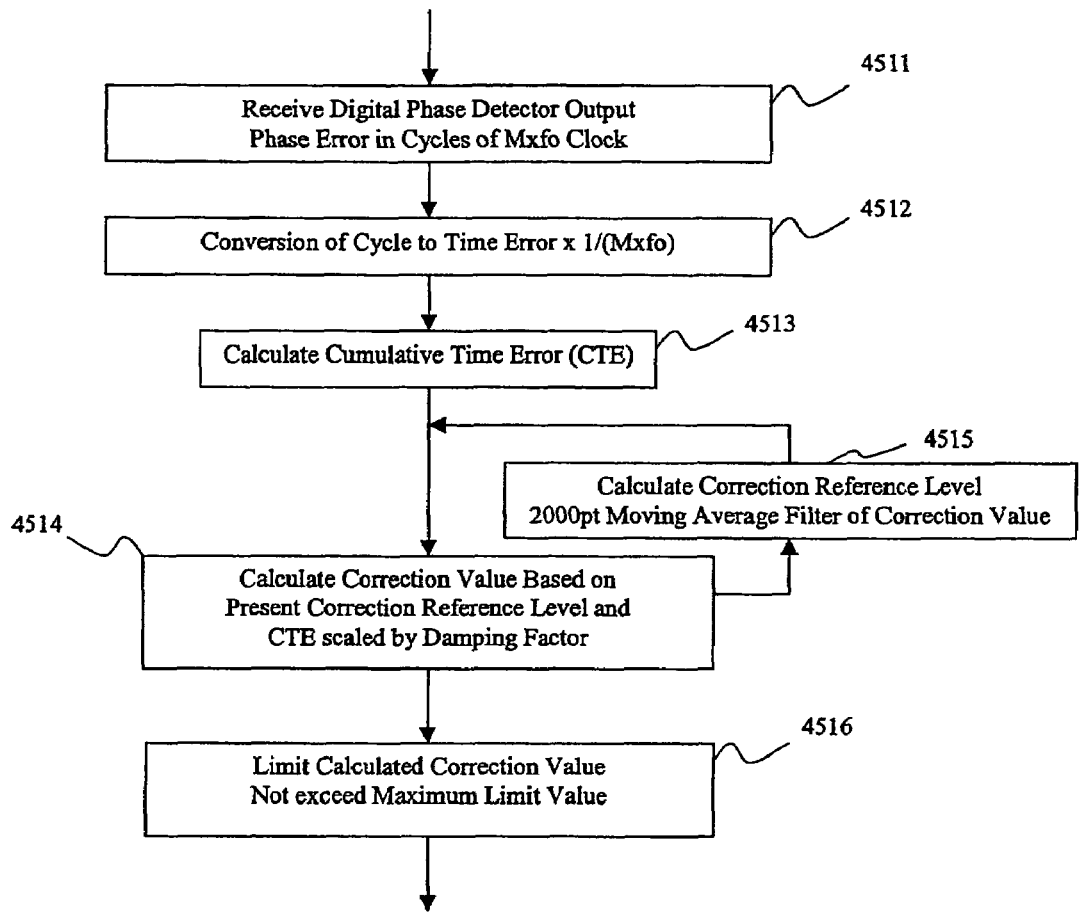
FIG. 4 is a flowchart showing the operation of a correction value calculator shown in FIG. 3.

FIG. 4 shows operation of the correction value calculator 1220 shown in FIG. 3. Referring to FIGS. 2, 3 and 4, the correction value calculator 1220 receives the phase detection signal 1126 from the digital phase detector 1115 (step 4511). The phase detection signal 1126 contains the phase error in terms of number of cycles of the frequency multiplied signal 1134 between the input reference timing signal 1125 and the frequency divided signal 1133. The phase error data is to be updated every second. The correction value calculator 1220 first converts the digital phase detector output from a number of foxM cycles to a time error in nanoseconds (step 4512). The cycle to time conversion is achieved through multiplication of the number of cycles output from the digital phase detector 1115 by the period of the frequency multiplied signal 1134. For example, the oscillation frequency is 10 MHz and the frequency multiplication factor M is 16, hence the frequency multiplied signal 1134 has a period of 6.25 ns.

If the digital phase detector 1115 outputs a count value of 10 cycles then the corresponding time error between the reference signal 1125 and the frequency divided signal 1133 is 10×6.25 ns or 62.5 ns. The correction value calculator 1220 next calculates cumulative time error ($CTE_J$) at time J (step 4513). The $CTE_J$ is calculated by:

$$CTE_J = CTE_{J-1} + \text{time error per second} \qquad (1)$$

where:

CTE$_{J-1}$ is the cumulative time error at time (J−1) (i.e., one second (one time step) earlier than time J); and The time error per second is the phase error in nanosecond.

The CTE is the second by second summation of the time error between the one pulse per second of the input reference timing signal 1125 and the one pulse per second of the frequency divided output signal 1133, the cycle of which is a division of the 10 MHz signal of the OCXO 1119.

Next, the correction value calculator 1220 calculates a correction value Cor based on a moving average of the past and present correction values and a value of the CTE scaled by a damping constant (step 4514). The correction value Cor is calculated by:

$$Cor = Corpr - CTE/\alpha \qquad (2)$$

where:

Corpr is a moving average of the past and present correction values; and

α is a damping factor for the control loop bandwidth.

The damping factor α is variable. The damping factor is set to unity during the initial pull and recovery mode to minimize the lock time of the PLL. Under the PLL-locked operation, the damping factor is set at 150, for example, to provide noise rejection against the second to second random phase variations caused by the satellite receiver noise.

Simultaneously, the correction value calculator 1220 calculates a level of the correction reference Corpr from a 2000 point moving average of the correction signal (step 4515) prior to passing through the correction limit (step 4516). The calculated level of the correction reference (i.e., Corpr) at step 4515 is used to calculate the cumulative correction signal (step 4514).

After the operation of step 4515 is performed, the correction value calculator 1220 limits the correction value Cor calculated to 45 ppb, for example, as required by the specification of the base station system, a single correction cannot exceed 45 ppb (step 4516). The correction signal output resulted from step 4516 is used to control the DAC 1117.

Again referring to FIGS. 2 and 3, upon completion of the nine-hour fine stabilization period of the delay time determined by the timer 1183, the timer 1183 is activated for a training purpose. When the timer 1183 is activated, the lock training controller 1187 provides the training initiation signal 1186 to close the delay switch 1201 of the correction calculation processor 1210, thereby allowing data to enter the compensation processor 1120 (the aging characteristic processing unit 1143). In a short time period (e.g., one second) after the delay switch 1201 is closed (on) in response to the training initiation signal 1186, the lock training controller 1187 provides the initial control signal 1185 to open the initial switch 1203. Thus, the initial data from the correction value calculator 1220 is stored in the correction initial value storage 1205. A stored initial data represented by the initial value signal 1149 is continuously provided from the correction initial value storage 1205, after the initial switch 1203 being opened. Thereafter, the correction value represented by the correction input signal 1202 is subtracted by the stored initial value in the subtractor 1204.

Offset data by the initial value is always fed by the subtractor 1204 to the IIRF 1151 of the aging characteristic processing unit 1143. Also, the stored initial value is provided to the adder 1158 to add it to the output data from the aging model calculator 1153, so that the offset initial value is compensated (or de-offset) at the output side of the aging model calculator 1153. When the delay switch 1201 is closed, the initial data value appearing at the output of the subtractor 1204 is 0, subsequent output values represent the fluctuation of the correction value from the initial correction value stored in the correction initial value storage 1205. Hence, a large step transient to the IIRF 1151 at time t=0 (with respect to the control loop training time) is avoided. The long time constant of the IIRF 1151 makes it important to avoid contamination thereof by a large initial correction offset which would take many days to acquire owing to the narrow bandwidth of the IIRF 1151.

The compensation processor 1120 includes a counter 1141, an aging characteristic processing unit 1143 and a temperature characteristic processing unit 1145. The counter 1141 counts pulses of the frequency divided signal 1133 to provide a frequency count signal 1147 to the aging characteristic processing unit 1143 and the temperature characteristic processing unit 1145.

When the GPS-generated timing signal is available (i.e., the input reference timing signal 1125 is provided by the GPS receiver 1113), the phase detection signal 1126 is fed to the correction calculation processor 1210. Then, the calculated correction signal 1148 is fed to the IIRF 1151 of the aging characteristic processing unit 1143. The filtered output signal from the IIRF 1151 is fed to an aging model calculator 1153 through an aging model update switch 1155 and a GPS-holdover mode switch 1157 when both switches are connected to their terminals "a". Each of the aging model update switch 1155 and the GPS-holdover mode switch 1157 has two terminals "a" and "b".

An aging model output signal 1152 from the aging model calculator 1153 is fed to the adder 1158 that adds the initial correction value subtracted by the subtractor 1204. The terminals "b" of the aging model update switch 1155 and the GPS-holdover mode switch 1157 are commonly connected to an output terminal of the aging model calculator 1153. The connection of the GPS-holdover mode switch 1157 is controlled by the mode-switching signal 1181 provided by the satellite-mode detector 1180 in accordance with the availability of the GPS-generated timing signal. The availability of the GPS-generated timing signal is determined by the satellite-mode detector 1180 that watches the lock status of the GPS receiver 1113. The GPS-holdover mode switch 1157 is connected to its terminals "a" and "b", when the GPS-generated timing signal is available and unavailable (i.e., the holdover period), respectively.

The frequency count signal 1147 from the counter 1141 is fed to a switching controller 1159 of the aging characteristic processing unit 1143 which controls the connections of the aging model update switch 1155 to its terminals "a" and "b". The switching controller 1159 determines whether the clock value Clk represented by the frequency count signal 1147 is equal to m×Int, wherein m is an update rate for aging model and Int is a predetermined maximum value (an integer). An example of the update rate m is one every 45 min. In a case of Clk being m×Int, the switching controller 1159 controls the aging model update switch 1155 to be connected to its terminal "a". In a case of Clk not being m×Int, the switching controller 1159 controls the aging model update switch 1155 to be connected to its terminal "b".

The calculated correction signal 1148 and the filtered output signal from the IIRF 1151 are fed to a subtractor 1161, the subtracted signal 1162 of which is fed to an IIRF 1163 of the temperature characteristic processing unit 1145. The filtered output signal from the IIRF 1163 is fed to a temperature model calculator 1165 and a turnover temperature logic unit 1167 through an aging model update switch 1169 and a GPS-holdover mode switch 1171 when both switches are connected to their terminals "a". Each of the temperature model update switch 1169 and the GPS-holdover mode switch 1171 has two terminals "a" and "b". The terminals "b" of both switches are commonly connected to an output terminal of the temperature model calculator 1165.

The connection of the GPS-holdover mode switch 1171 is controlled by the mode-switching signal 1181. The GPS-holdover mode switch 1171 is connected to its terminals "a' and "b", when the GPS-generated timing signal is available and unavailable, respectively. The frequency count signal 1147 is fed to a switching controller 1173 of the temperature characteristic processing unit 1145 which controls the temperature model update switch 1169 to be connected to its terminals "a" and "b".

The switching controller 1173 determines whether the clock value Clk represented by the frequency count signal 1147 is equal to p×Int, wherein p is an update rate for temperature model and Int is a predetermined maximum value. An example of the update rate p is one every 1.5 min. In a case of Clk being p×Int, the switching controller 1173 controls the temperature model update switch 1169 to be connected to its terminal "a". In a case of Clk not being p×Int, the switching controller 1173 controls the temperature model update switch 1169 to be connected to its terminal "b".

The temperature signal 1131 from the temperature sensor 1129 of the OCXO 1119 is fed to the temperature model calculator 1165 and the turnover temperature logic unit 1167. The turnover temperature logic unit 1167 performs temperature calculation in accordance with the oscillator temperature and the IIRF filtered output to provide a turnover temperature signal 1175 to the temperature model calculator 1165. In response to the turnover temperature signal 1175, the temperature model calculator 1165 performs temperature model calculation in accordance with the IIRF filtered output and the oscillator temperature and provides a temperature model output signal 1166 representing the updated temperature model output value.

The aging processor output signal 1154 from the adder 1158 and the temperature model output signal 1166 from the temperature characteristic processing unit 1145 are fed to the adder 1177 to provide the compensation processor output signal 2231. The compensation processor output signal 2231 is fed to the delay compensation processor 2211 to be time-delayed. The compensation processed signal 1179 in digital form from the delay compensation processor 2211 is fed to the DAC 1117 which controls the voltage of the EFC input signal 1118 in analog form applied to the OCXO 1119. The OCXO 1119 performs oscillation in accordance with the EFC input signal 1118, regardless whether the GPS-generated timing signal is available (in the GPS locked mode) or the GPS-generated timing signal is unavailable when the base station loses contact with GPS satellite, i.e., the holdover period (the holdover mode).

Each of the aging model calculator 1153 and the temperature model calculator 1165 includes a Kalman filter. The Kalman filter includes a model relating to the characteristics of the OCXO 1119 and provides an error estimate amount as an output. The Kalman filter is known to those skilled in the art. It may comprise a model which performs state estimation, forecasting for oscillator characteristics of frequency aging and temperature. The Kalman filter provides internal estimates of the variances of each of the state estimates. The Kalman filter includes various algorithms necessary to perform prediction error analysis and to estimate the time, frequency, and frequency aging over an initial interval and then forecasts them into the future. The operation of Kalman filter is described in U.S. Pat. No. 5,144,595, which is incorporated herein by reference.

Figure 5:
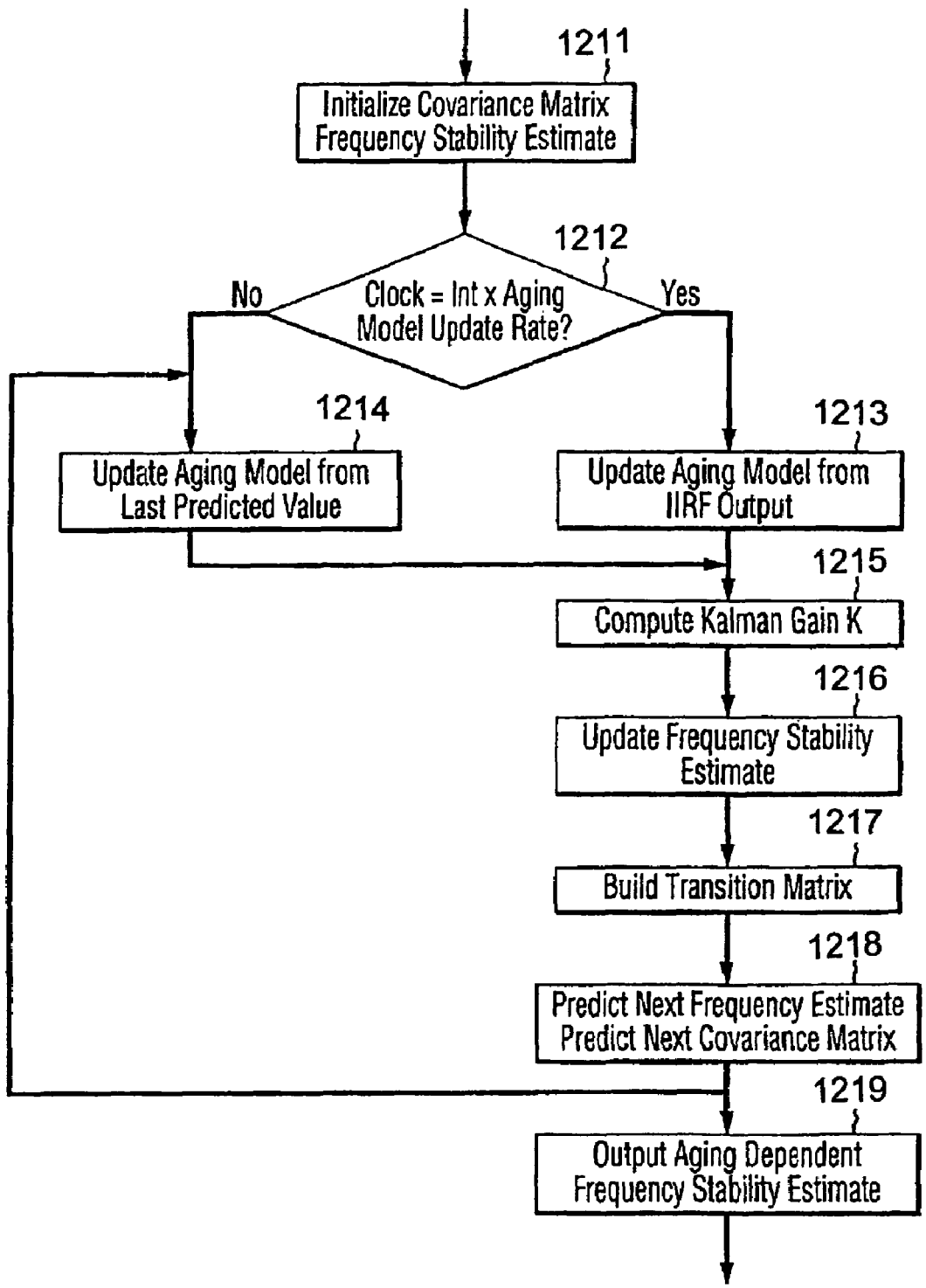
FIG. 5 is a flowchart showing the operation of an aging model calculator in the reference timing signal apparatus shown in FIG. 2.

When the GPS-generated timing signal is available as determined by the satellite-mode detector 1180, the PLL including the compensation processor 1120 operates in the GPS locked mode and the aging model calculator 1153 of the aging characteristic processing unit 1143 performs aging dependency frequency stability calculation. FIG. 5 shows its operation. Referring to FIGS. 2, 3 and 5, the GPS-holdover mode switch 1157 of the aging characteristic processing unit 1143 is connected to its terminal "a" for the GPS locked mode, in response to the mode-switching signal 1181. The aging model calculator 1153 initializes its covariance matrix and frequency stability estimates (step 1211). The covariance matrix captures the variance of the variants and the covariance of the variants. Variants in the embodiment are the frequency dependence on aging and frequency dependence on temperature. The variance of the variants is captured in the diagonal elements of the covariance matrix. The remaining elements of the matrix capture the covariant terms in the case where the variants are independent such as the present case and the covariant terms are zero.

The switching controller 1159 determines whether the clock value Clk represented by the frequency count signal 1147 is equal to m (the update rate for aging model)×the predetermined maximum value Int (step 1212). If Clk is equal to m×Int (positive at step 1212), the switching controller 1159 controls the aging model update switch 1155 to be connected to its terminal "a". The IIRF filtered output value from the IIRF 1151 responding to the phase detection signal 1126 is fed to the aging model calculator 1153 which in turn updates the aging model in accordance with the fed IIRF filtered value (step 1213). Thus, it is updated by the raw input data measured based on the GPS-generated timing signal.

If Clk is not equal to m×Int (negative at step 1212), the switching controller 1159 controls the aging model update switch 1155 to be connected to its terminal "b". The aging model calculator output is fed back to the aging model calculator 1153 through the aging model update switch 1155 and the GPS-holdover mode switch 1157 and thus, the aging model is updated by the last (or the preceding) predicted value of that aging model (step 1214). After the update of the aging model at step 1213 or 1214, the Kalman gain "K" is computed (step 1215) and the frequency stability estimate is updated (step 1216). The Kalman gain is calculated as blending factor which determines the degree of emphasis to be placed on the next noisy measurement and the prior estimate of the measurement. The Kalman gain is this linear blending factor.

After the computation of the Kalman gain, a transition matrix is built (step 1217). The following is an example of the transition matrix formulation for aging and temperature models.

$$A = \begin{bmatrix} 1 & V_t \cdot \Delta t & a_t \cdot \frac{\Delta t^2}{2} & 0 & 0 & 0 \\ 0 & 1 & V_t \cdot \Delta t & 0 & 0 & 0 \\ 0 & 0 & 1 & 0 & 0 & 0 \\ 0 & 0 & 0 & 1 & V_T \cdot \Delta T & a_T \cdot \frac{\Delta T^2}{2} \\ 0 & 0 & 0 & 0 & 1 & V_T \cdot \Delta T \\ 0 & 0 & 0 & 0 & 0 & 1 \end{bmatrix}$$

where:
$\Delta t$ is a time step;
$\Delta T$ is a temperature step;
$V_t$ is a weighting term on the first derivative aging dependent model;

$a_t$ is a weighting term on the second derivative aging dependent model;

$V_T$ is a weighting term on the first derivative temperature dependent model; and $a_T$ is a weighting term on the second derivative temperature dependent model.

It is noted that the transition matrix may be expanded to include higher order non linearity terms $\Delta t^3$, $\Delta t^4$, .... However, in this embodiment, the aging and temperature dependent characteristics of the OCXO 1119 are well modeled by linear dependencies with appropriate weighting functions.

The transition matrix contains the state update equations which when applied to the current state generate the next predicted state. The next frequency estimate and the next covariance matrix are predicted (step 1218). After step 1218 is performed, steps 1214-1218 are repeated. In accordance with the predicted frequency estimate and covariance matrix, the aging dependent frequency estimate is provided by the aging model calculator 1153 of the aging characteristic processing unit 1143 (step 1219).

Figure 6:
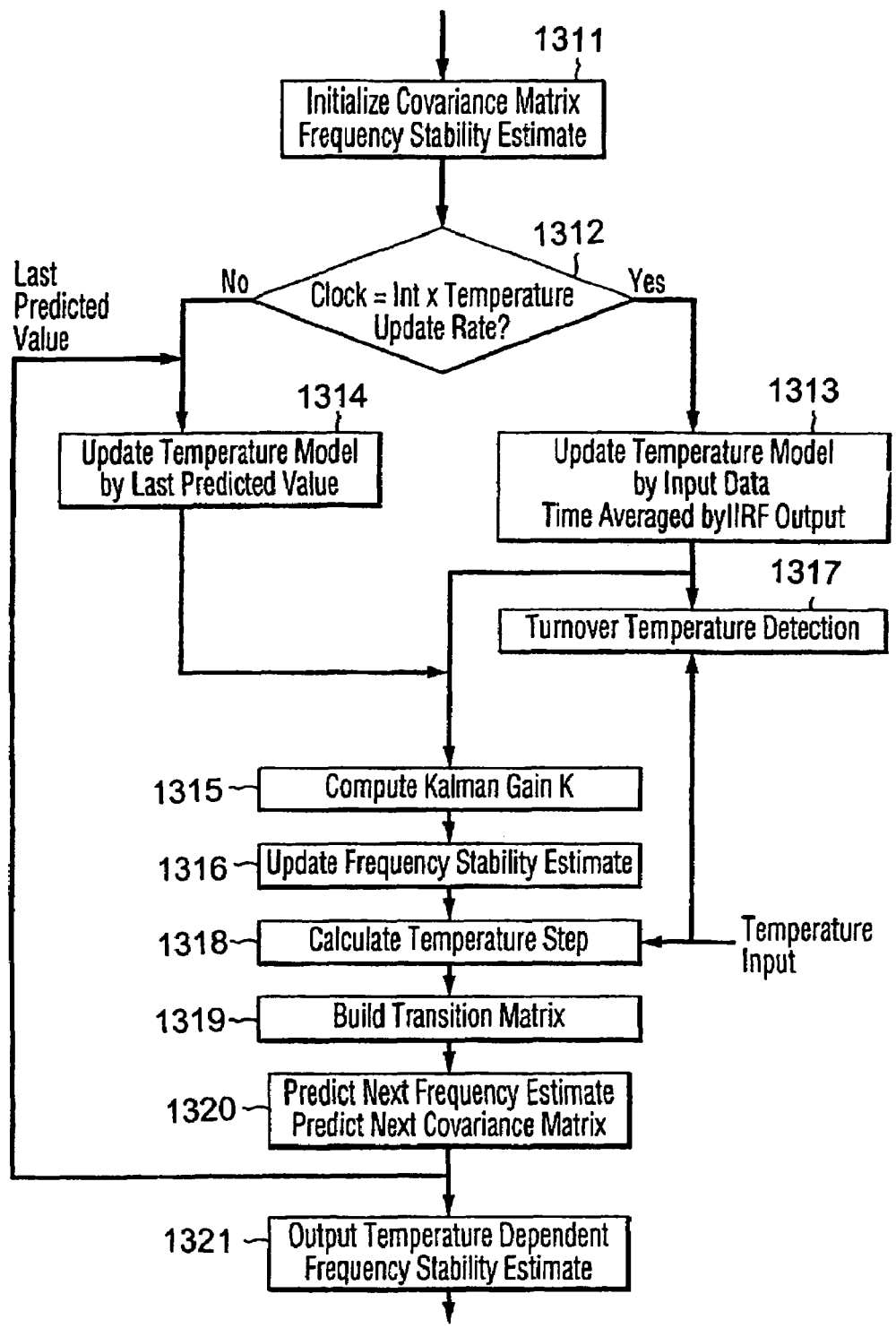
FIG. 6 is a flowchart showing the operation of the temperature model calculator in the reference timing signal apparatus shown in FIG. 2.

In the GPS locked mode, the temperature model calculator 1165 of the temperature characteristic processing unit 1145 performs temperature dependent frequency stability calculation. FIG. 6 shows its operation. Referring to FIGS. 2, 3 and 6, the GPS-holdover mode switch 1171 of the temperature characteristic processing unit 1145 is connected to its terminal "a" for the GPS locked mode, in response to the mode-switching signal 1181. The temperature model calculator 1165 initializes the covariance matrix and the frequency stability estimate (step 1311). The switching controller 1173 determines whether the clock value Clk represented by the frequency count signal 1147 is equal to p (the update rate for temperature model)×the predetermined maximum value Int.

If Clk=p×Int (positive at step 1312), the switching controller 1173 controls the temperature model update switch 1169 to be connected to its terminal "a". The subtractor 1161 subtracts the filtered output of the IIRF 1151 from the data represented by the calculated correction signal 1148. The subtracted data represented by the subtracted signal 1162 is filtered by the IIRF 1163, the IIRF filtered output data of which is fed to the temperature model calculator 1165. The temperature model calculator 1165 updates the temperature model in accordance with the subtracted data and averages time of the subtracted data (step 1313).

If Clk is not p×Int (negative at step 1312), the switching controller 1173 controls the temperature model update switch 1169 to be connected to its terminal "b". The temperature model output signal 1166 of the temperature model calculator 1165 is fed back to the input of the temperature model calculator 1165. Thus, the temperature model calculator 1165 updates the temperature model by the last (or the preceding) predicted value (step 1314). After performing step 1313 or step 1314, the temperature model calculator 1165 computes the Kalman gain K (step 1315) and the frequency stability estimate is calculated (step 1316).

The sensed temperature relating to the OCXO 1119 is provided to the temperature model calculator 1165 and the turnover temperature logic unit 1167 by the temperature signal 1131. The turnover temperature logic unit 1167 calculates or detects the turnover temperature, in accordance with the IIRF filtered value, the averaged time calculated at step 1313 and the sensed temperature (step 1317). The calculated turnover temperature is provided to the temperature model calculator 1165 from the turnover temperature logic unit 1167. The temperature model calculator 1165 calculates the temperature step $\Delta T$ (step 1318).

In accordance with the calculated turnover temperature, the temperature step and the IIRF filtered value, the temperature model calculator 1165 updates the temperature model thereof. Thus, the transition matrix is built (step 1319) and next frequency estimate and next covariance matrix are predicted (step 1320). The transition matrix is shown above as the transition matrix formulation A. Then, step 1314-1320 are repeated. After step 1320, the updated temperature model output is provided by the temperature model calculator 1165 as the temperature model output signal 1166 which represents the output temperature dependent frequency stability estimate (step 1321).

The aging processor output signal 1154 and the temperature model output signal 1166 are fed to the adder 1177 to be added to provide the compensation processor output signal 2231. The compensation processor output signal 2231 is fed to the delay compensation processor 2211 that compensates the time-delay of the IIRF 1163 present in the temperature model. The delay compensation processor 2211 determines the rate of change of the output of the temperature model calculator 1165 on a second by second basis.

A 100 point moving average of the temperature model output gradient is calculated and used in conjunction with the known IIRF filter delay to determine the delay in the temperature model output signal. The delay compensation value is calculated by multiplication of the temperature model output gradient by the IIRF 1163's delay. The delay compensation value is added to the predicted output from adder 1177 during holdover. At the end of the holdover period, the delay compensation value is reset to zero and populated by new delay compensation values calculated during the subsequent locked mode operation of the system. The delay compensation processor 2211 provides the DAC 1117 with the compensation processed signal 1179. In response to the compensation processed signal 1179, the DAC 1117 provides the EFC input signal 1118 in accordance with the output aging dependent frequency stability estimate and the output temperature dependency frequency stability estimate. Thus, the OCXO 1119 is controlled by both the aging and temperature dependent frequency estimates.

Figure 7:
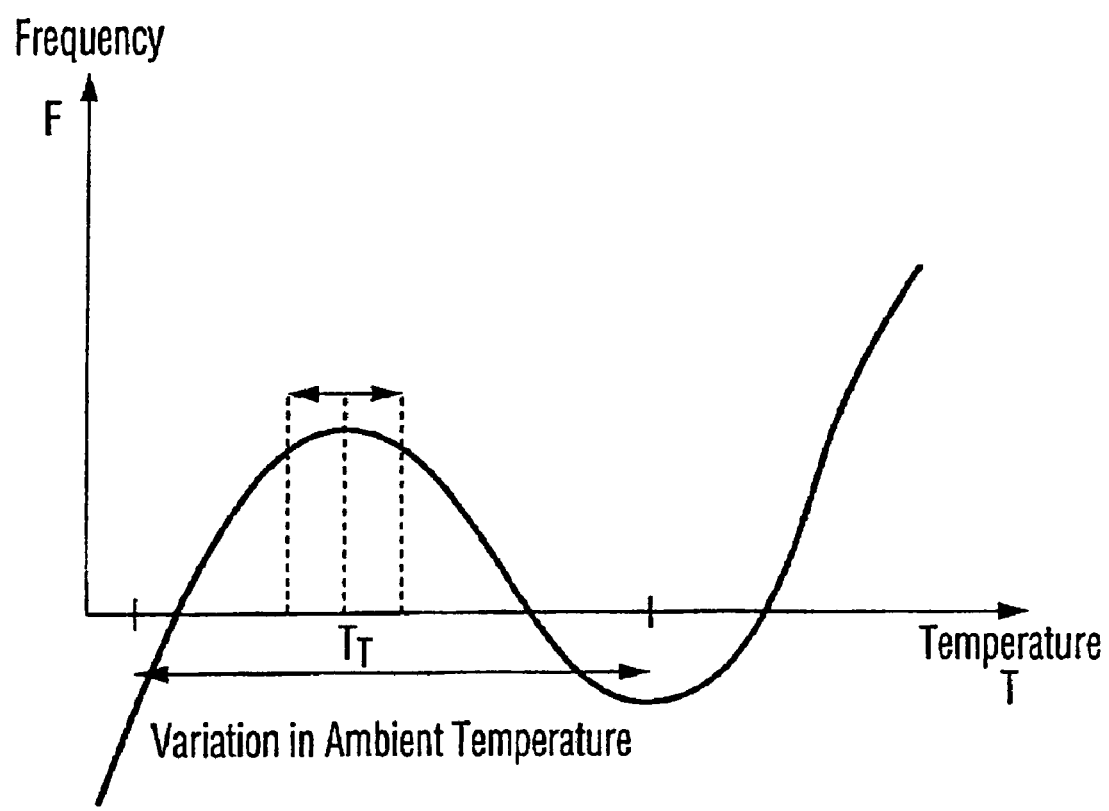
FIG. 7 depicts a form of the frequency (F) vs. temperature (T) characteristic for an SC cut crystal used in an oscillator included in the reference timing signal apparatus shown in FIG. 2.

In a case where the OCXO 1119 uses an SC cut crystal, the form of its frequency (F) vs. temperature (T) characteristic is taken as shown in FIG. 7. The form of the F-T characteristic is taken in the temperature range experienced by a crystal due to ovenization. As the turnover temperature $T_T$ is passed the dF/dT slope changes sign (from + to − or from − to +). It is necessary to detect such a distinction of the temperature characteristic as the turnover temperature and then apply it to the transition matrix of the Kalman filter to ensure the Kalman filter gradient dF/dt changes sign. It is noted that dF/dT is the rate of change in frequency with temperature and dF/dt is the rate of change in frequency with time.

Figure 8:
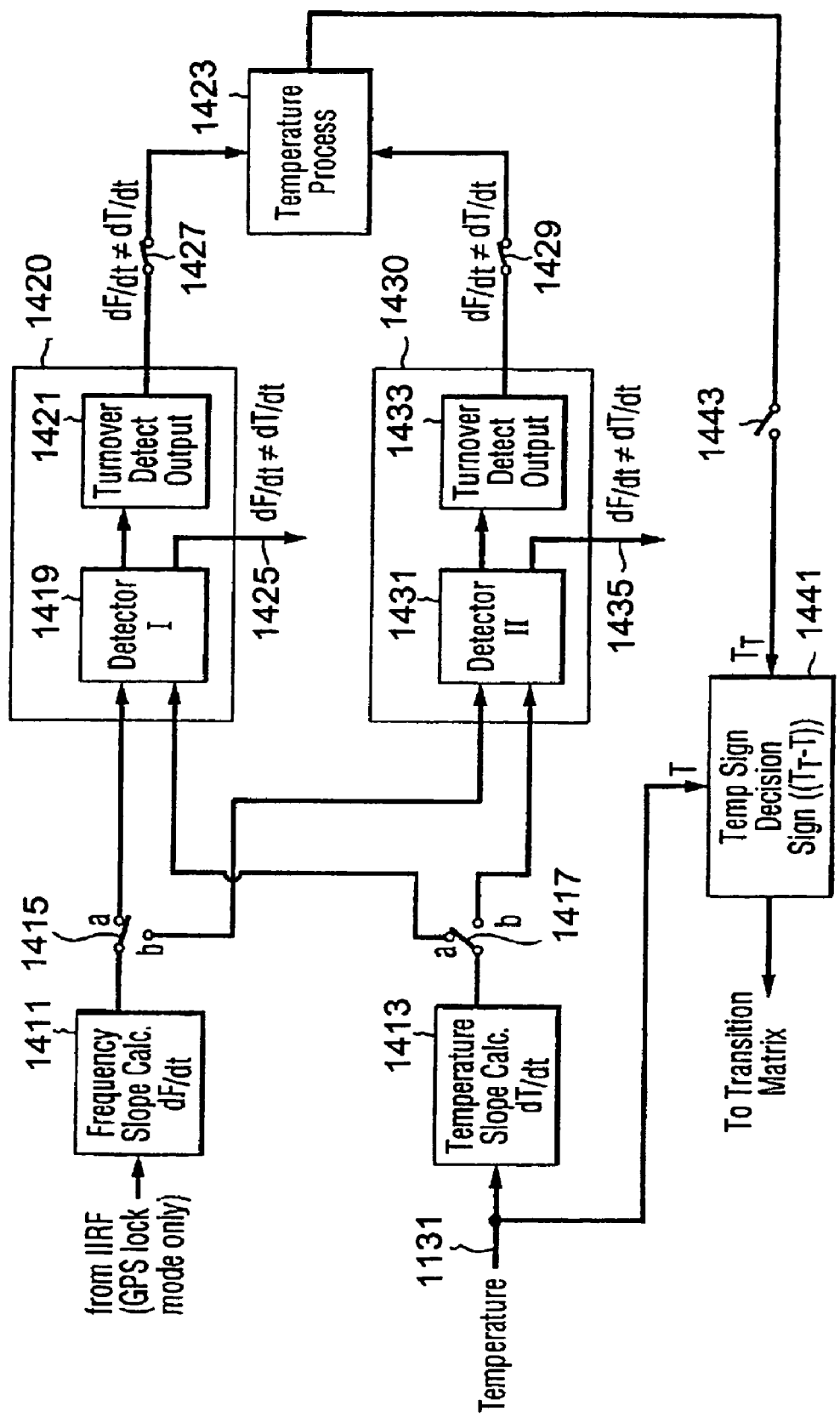
FIG. 8 shows a detail of a turnover temperature calculation unit included in the reference timing signal apparatus shown in FIG. 2.
Figure 9:
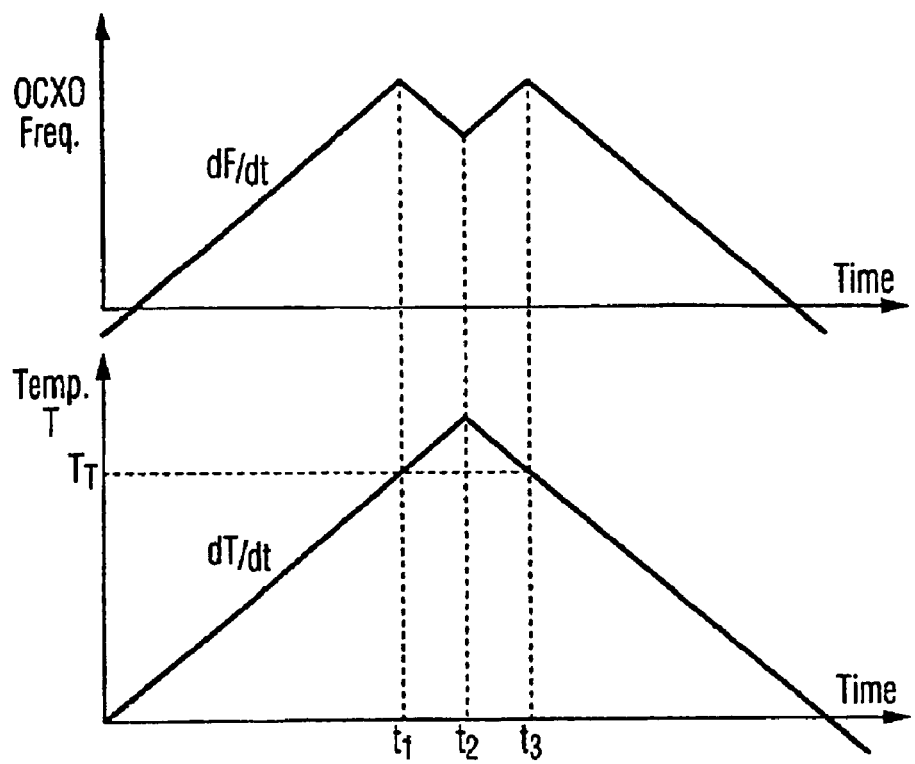
FIG. 9 shows the characteristic of the rates dF/dt and dT/dt for detecting the turnover temperature in the GPS locked mode.

FIG. 8 shows the turnover temperature logic unit 1167 shown in FIG. 2. FIG. 9 shows the characteristic of the rates dF/dt and dT/dt for detecting the turnover temperature in the GPS locked mode. Referring to FIGS. 2, 3, 8 and 9, the IIRF filtered value from the IIRF 1163 is fed to a frequency slope calculator 1411 in the GPS locked mode only to calculate a frequency slope dF/dt. The sensed temperature (T) represented by the temperature signal 1131 is provided to a temperature slope calculator 1413 to calculate a temperature slope dT/dt.

When a detector selection switch 1415 and another detector selection switch 1417 are connected to their terminals "a", the frequency slope dF/dt and the temperature slope dT/dt are provided to a slope detector 1419 of a turnover detector 1420. If the sign of dF/dt is equal to the sign of dT/dt, no turnover temperature will be detected (e.g., prior to time $t_1$ as shown in FIG. 9). If the sign of dF/dt is not equal to the sign of dT/dt, a turnover temperature $T_T$ will be detected (e.g., at times $t_2$, and $t_3$). A detection output unit 1421 provides a turnover signal to a temperature processor 1423 through a GPS locked mode switch 1427. The GPS locked mode switch 1427 is on (closed) in the GPS locked mode only. The slope detector 1419 provides an activation signal 1425.

In response to the activation signal 1425, the detector selection switch 1415 and the detector selection switch 1417 switch their connections to their terminals "b" to activate a turnover detector 1430. The outputs dF/dt and dT/dt from the frequency slope calculator 1411 and the temperature slope calculator 1413 are fed to a slope detector 1431 of the turnover detector 1430. If the sign of dF/dt is equal to the sign of dT/dt, the turnover temperature $T_T$ will be detected. A turnover detection output unit 1433 provides a turnover signal to the temperature processor 1423 through a GPS locked mode switch 1429. The GPS locked mode switch 1429 is on (closed) in the GPS locked mode only. The slope detector 1431 provides an activation signal 1435.

In response to the turnover signals from the turnover detection output unit 1421 and the turnover detection output unit 1433, the temperature processor 1423 holds the input temperature in variable turnover temperature and in moving average filter. In response to the activation signal 1435, the detector selection switch 1415 and the detector selection switch 1417 switch their connections to their terminals "a" to activate the turnover detector 1420.

A holdover mode switch 1443 is on (closed) in the holdover mode only and thus, no temperature processed signal from the temperature processor 1423 is provided to a temperature sign detector 1441 in the GPS locked mode. In accordance with the temperature T, the temperature sign detector 1441 detects the temperature sign $S_T$ and provides it to the temperature model calculator 1165. The sign $S_T$ is used to build the transition matrix of the temperature model by the temperature model calculator 1165 (step 1319 in FIG. 6).

Referring to FIG. 2, when the base station loses contact with GPS satellite as detected by the satellite-mode detector 1180, the GPS-generated timing signal is unavailable to the PLL and the compensation processor 1120. The PLL needs to operate in the holdover mode during the period of lacking of the GPS-generated timing signal, so as to provide the base station reference timing signal 1127.

In the holdover mode, the OCXO 1119 operates as a self-oscillator, the frequency of which is controlled by the steering voltage, in accordance with the characteristics of the aging and temperature models of the Kalman filters. In the holdover mode, the GPS-holdover mode switches 1157 and 1171 are connected to their terminals "b". The aging model output signal 1152 is fed back to its input terminal through the GPS-holdover mode switch 1157 and the temperature model output signal 1166 is fed back to its input terminal through the GPS-holdover mode switch 1171.

Referring to FIGS. 2 and 8, the GPS locked mode switches 1427 and 1429 are off (open) and thus, the temperature processor 1423 does not perform new processing. The holdover mode switch 1443 of the turnover temperature logic unit 1167 is on (closed) and thus, temperature processed signal from the temperature processor 1423 is provided to the temperature sign detector 1441 which provides an output sign $S_T$ to the temperature model calculator 1165, in accordance with the temperature processed signal from the temperature processor 1423 and the temperature T. The sign $S_T$ is applied as a multiplier to the temperature step of the temperature model aspect of the transition matrix 'A' by the temperature model calculator 1165.

Figure 10:
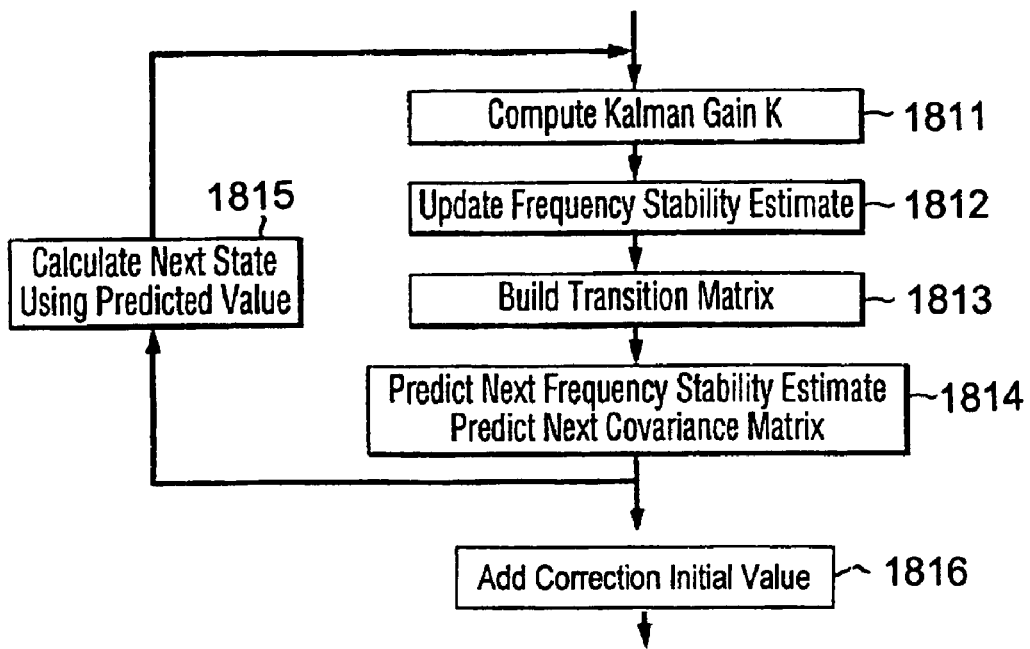
FIG. 10 is a flowchart showing the operation of the aging dependent frequency stability calculator in the holdover mode.

FIG. 10 shows the aging dependent frequency stability calculation in the holdover mode. Referring to FIGS. 2, 3 and 10, the aging model calculator 1153 of the aging characteristic processing unit 1143 uses covariance matrix and frequency stability estimates predicted by using the adaptive algorithm. Prior to the holdover mode, the aging model calculator 1153 sets its covariance matrix and frequency stability estimates, in the GPS locked mode.

The aging model calculator 1153 computes the Kalman gain K (step 1811). The frequency stability estimate is updated (step 1812). The transition matrix is built (step 1813). The transition matrix is shown above as the transition matrix formulation A. The transition matrix contains the state update equations which when applied to the current state generate the next predicted state. The next frequency stability estimate and next covariance matrix are predicted (step 1814). Next state is calculated using the predicted values (step 1815) and steps 1811-1814 are repeated. The aging model calculator 1153 outputs the frequency dependency values in accordance with the estimate predicted at step 1814. The output values are added to the correction initial value represented by the initial value signal 1149 by the adder 1158 (step 1816), so that the added data is provided by the aging processor output signal 1154.

The initial correction value is added to the output of the aging model to account for the initial correction value subtraction at the input of the compensation processor 1120. In this manner, the initial step correction value of the locked correction loop with respect to time 0 correction bypasses the compensation processor thus avoiding saturation of the aging model IIRF 1151. In accordance with the predicted next frequency stability estimate and covariance matrix, the aging dependent frequency estimate is provided by the aging model calculator 1153. Thus, the aging model calculator 1153 uses the predicted covariance matrix and frequency stability estimates obtained at step 1814. The aging dependent frequency estimate is represented by the aging processor output signal 1154 from the aging characteristic processing unit 1143.

Figure 11:
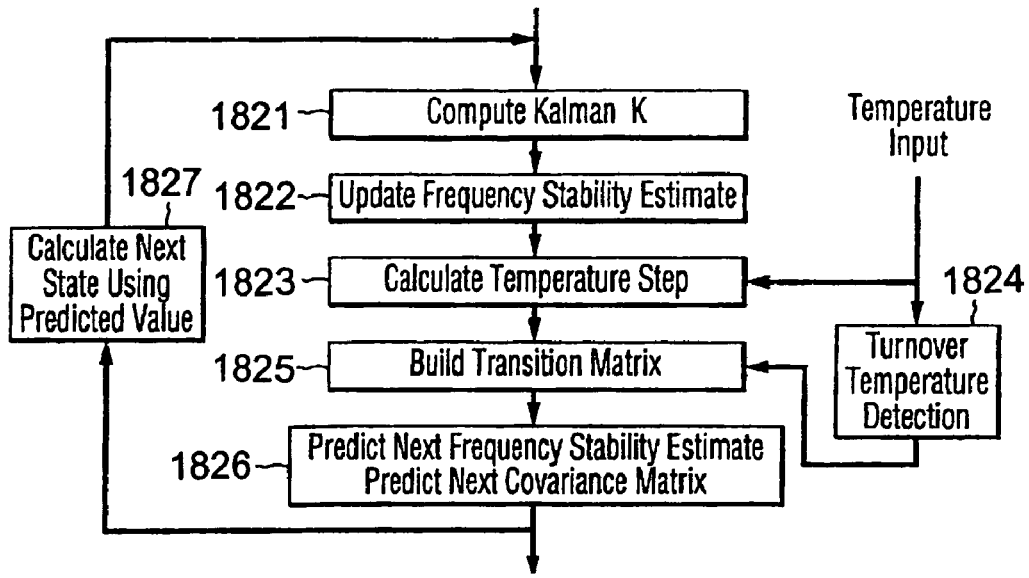
FIG. 11 is a flowchart showing the operation of the temperature dependent frequency stability calculator in the holdover mode.

FIG. 11 shows the temperature dependent frequency stability calculation in the holdover mode. Referring to FIGS. 2, 7, 8 and 11, the temperature model calculator 1165 of the temperature characteristic processing unit 1145 uses covariance matrix and frequency stability estimate predicted by using the adaptive algorithm. Prior to the holdover mode, the temperature model calculator 1165 sets its covariance matrix and frequency stability estimates, in the GPS locked mode.

The temperature model calculator 1165 computes the Kalman gain K (step 1821). The frequency stability estimate is updated (step 1822). The sensed temperature from the temperature sensor 1129 is fed to the temperature model calculator 1165 by the temperature signal 1131. The temperature model calculator 1165 calculates the temperature step $\Delta T$ (step 1823). In accordance with the temperature T, the turnover temperature logic unit 1167 calculates or detects the turnover temperature $T_T$ (step 1824). The holdover mode switch 1443 is on in the holdover mode and the turnover temperature $T_T$ is provided from the temperature processor 1423 to the temperature sign detector 1441. The temperature sign detector 1441 determines the sign of the difference between the turnover temperature $T_T$ and the sensed temperature T, ($T_T$-T), and the weighting term $V_T$ is detected thereby.

In response to the calculated temperature and the turnover temperature detection, the temperature model calculator 1165 builds the transition matrix (step 1825) and applies the sign detected by the temperature sign detector 1441 to the weighting factor $V_T$ in the temperature model by multiplying $V_T$ by the turnover temperature sign. Next frequency stability estimate and next covariance matrix are predicted (step 1826). Thereafter, the next state is calculated using the predicted values (step 1827) and steps 1821-1826 are repeated. After step 1826 is performed, the temperature dependent frequency estimate is provided. Thus, the temperature model calculator 1165 uses the predicted covariance matrix and frequency stability estimate obtained at step 1826. In accordance with the predicted next frequency stability estimate and covariance matrix, the temperature dependent frequency estimate is provided by the temperature model calculator 1165.

The aging dependent frequency estimate represented by the aging processor output signal 1154 from the aging characteristic processing unit 1143 and the temperature dependent frequency estimate represented by the temperature model output signal 1166 from the temperature characteristic processing unit 1145 are fed to the adder 1177. The compensation processor output signal 2231 from the adder 1177 includes both the aging and temperature dependent estimates. The compensation processor output signal 2231 is time-delay compensated by the delay compensation processor 2211. Thus, the compensation processed signal 1179 includes both the aging and temperature dependent estimates which are provided to the DAC 1117 to control the frequency of the OCXO 1119. The predicted frequency values generated in accordance with the updated model provide the necessary reference for compensation of the OCXO 1119. In the holdover mode, temperature input values are continuously available to the compensation algorithm and it self-propagates the temperature model to be updated. The updated model is highly accurate as a result of the characteristic models frequency updates during the locked period up until the initiation of holdover.

Figure 12:
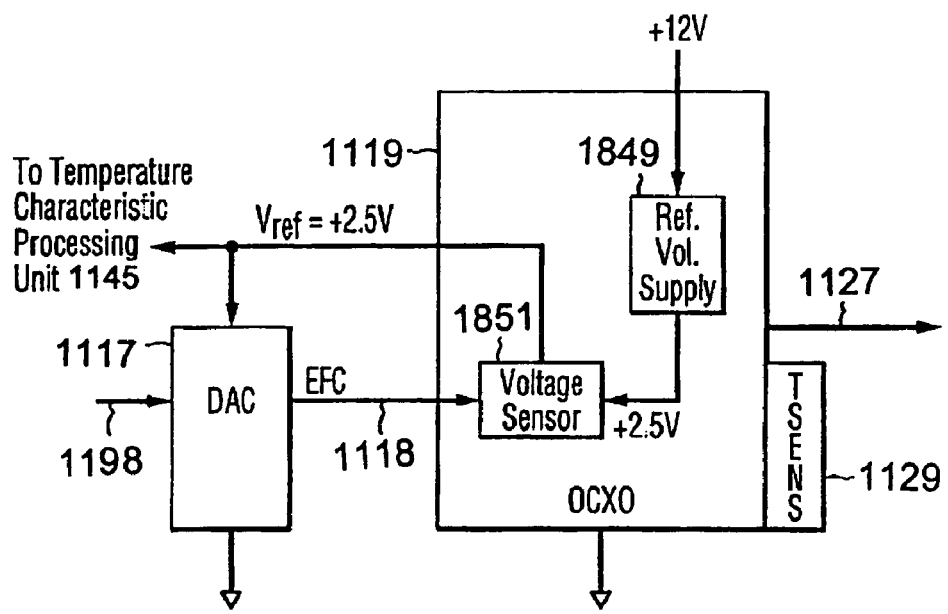
FIG. 12 is a block diagram which depicts a voltage sensor in an oven-controlled crystal oscillator (OCXO) for providing a reference voltage to a digital-to-analog converter (DAC) shown in FIG. 2.

Another element of the frequency dependent stability is the power supply voltage of the OCXO 1119. FIG. 12 shows the OCXO 1119 for providing a reference voltage to the DAC 1117. In FIG. 12, a supply voltage (e.g., +12 volts) is provided to the OCXO 1119 for its operation. A reference voltage supply unit 1849 included in the OCXO 1119 provides an ovenized voltage (e.g., +2.5 volts) which is sensed by a voltage sensor 1851 which in turn provides an ovenized reference voltage $V_{ref}$ to the DAC 1117. This reference voltage $V_{ref}$ is fed to the temperature model calculator 1165 of the temperature characteristic processing unit 1145 shown in FIG. 2. The temperature model calculator 1165 calculates the temperature model in accordance with the voltage, among others. Thus, the frequency stability is achieved against the variation of the power supply voltage over time.

Figure 13:
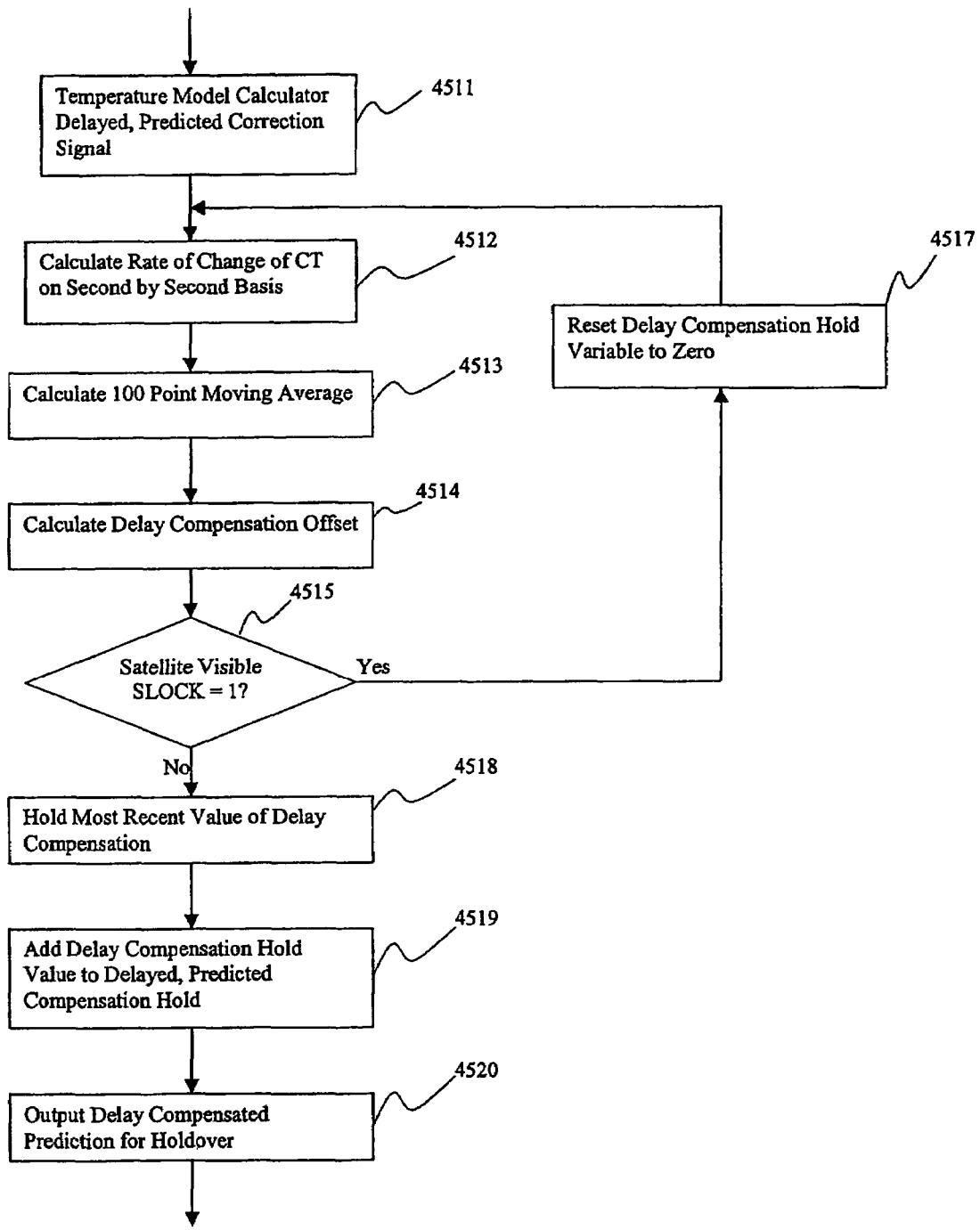
FIG. 13 is a flowchart showing the operation of a delay compensation processor shown in FIG. 2.

FIG. 13 shows detailed operation of the delay compensation processor 2211. Referring to FIGS. 2, 3 and 13, the delay compensation processor 2211 receives the temperature model calculator delayed, predicted correction data CT represented by the temperature model output signal 1166 (step 4511). The delay compensation processor 2211 calculates a rate of change of the correction data, $\Delta CT/\Delta t$, on a second by second basis (step 4512):

$$\Delta CT/\Delta t = (CT_K - CT_{K-1})/(t_K - t_{K-1}) \qquad (3)$$

where:

$\Delta t$ is a time step, $t_K - t_{K-1}$;

$CT_K$ is correction data at time $t_K$; and $CT_{K-1}$ is correction data at time $t_{K-1}$.

Then, the delay compensation processor 2211 calculates 100 point moving average $AVE_{CT}$ of the change rate $\Delta CT/\Delta t$ (step 4513) and calculates a delay compensation offset OFFSET (step 4514) by:

$$\text{OFFSET} = AVE_{CT} \times \text{IIRF}_{DELAY} \qquad (4)$$

where $\text{IIRF}_{DELAY}$ is a time delay of the IIRF 1163.

Next, the GPS mode is checked (step 4515). In a case of the GPS-locked mode (visible) (positive at step 4515), the delay compensation processor 2211 resets the delay compensation hold value to zero, (step 4517) and then it returns to step 4512. The delay compensation offset is recalculated. This update is enabled in response to the mode-switching signal 1181.

In a case of non-visible (negative at step 4515), the delay compensation is unchanged and the most recent value of the delay compensation is held (step 4518). The delay compensation hold value is added to the data represented by the compensation processor output signal 2231 from the adder 1177 (step 4519). The added resultant is provided as the delay compensated prediction for the holdover (step 4520). The delay compensated data represented by the compensation processed signal 1179 is fed to the DAC value selection switch 1197.

Figure 14:
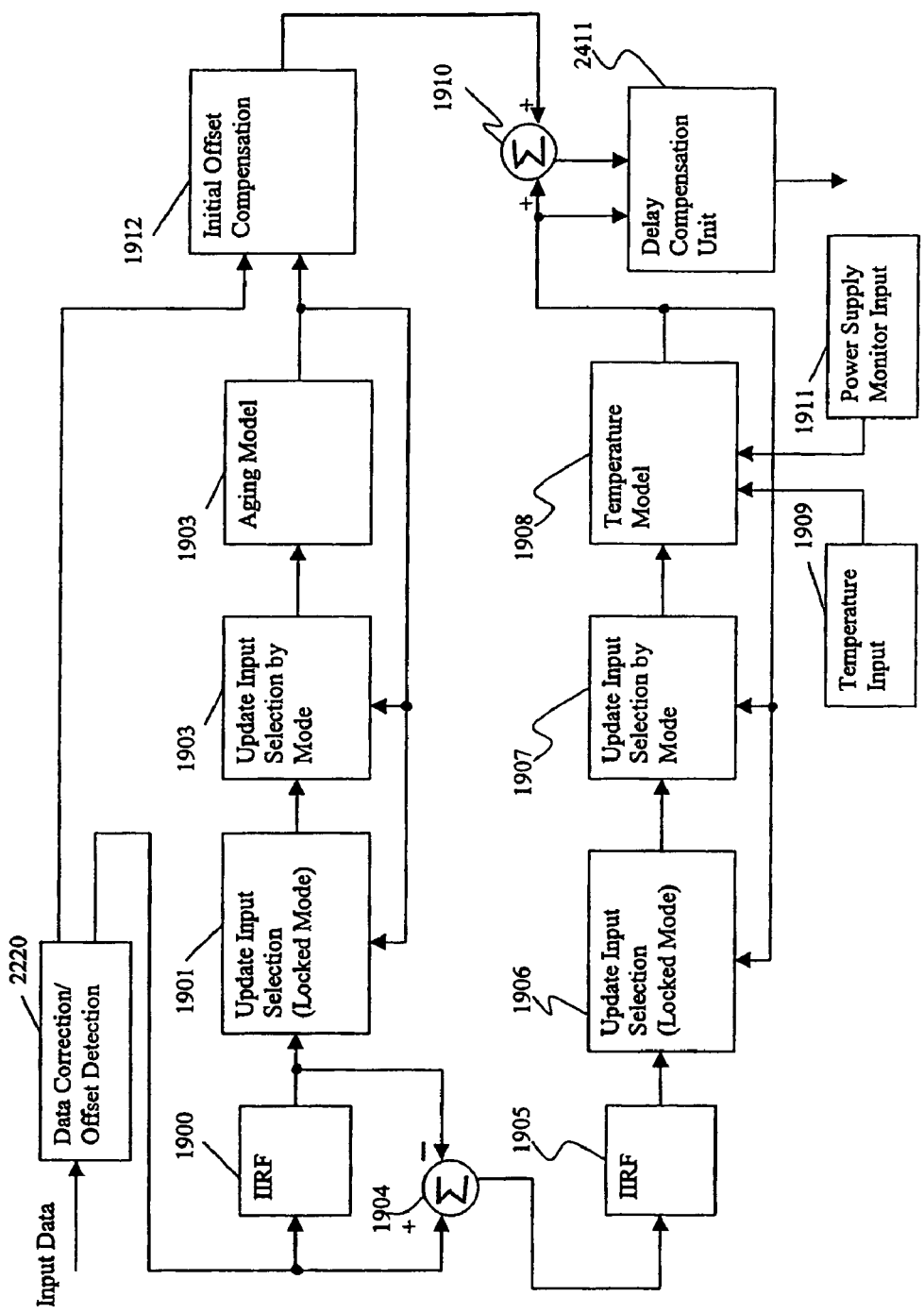
FIG. 14 illustrates the function of another embodiment according to the present invention.

FIG. 14 illustrates the function of another embodiment according to the present invention, wherein the frequency dependent stability of power supply voltage is implemented. The function of each block shown in FIG. 14 corresponds to that of each block and unit shown in FIGS. 1 and 2.

Referring to FIG. 14, input data of a PLL control loop phase difference for the reference oscillator (not shown) is fed to correction calculator/offset detector 2220 that produces correction data and initial offset data. The correction data is fed to an IIRF 1900 which in turn provides its IIRF filtered output data to a locked-mode input selector 1901. The locked-mode input selector 1901 selects update input data and its selected data is fed to a GPS-holdover input selector 1902 which provides selected data, in accordance with a mode, to an aging model calculator 1903. In the GPS locked mode, the data selected by the locked-mode input selector 1901 is fed to the aging model calculator 1903.

The aging model calculator 1903 calculates Kalman filter function values in accordance with the input data and updates an aging model thereof, so that the future frequency state of the oscillator is predicted from the updated model. The aging model relates to the aging characteristic of the oscillator. The output data from the aging model calculator 1903 is fed to an initial offset compensation unit 1912 that adds the initial offset data provided by the correction calculator/offset detector 2220, thus bypassing IIRF 1900 with respect to the initial correction offset. In accordance with the updated model, output data is fed from the output of the aging model calculator 1903 to the locked-mode input selector 1901 and the GPS-holdover input selector 1902. In the event that the aging model needs to be periodically updated by its preceding state, the locked-mode input selector 1901 selects the output data of the aging model calculator 1903 as an input data, so that the output data is fed back to the input of the aging model calculator 1903.

Accordingly, the aging model is updated by the preceding state. In the holdover mode, the input data is unavailable and the GPS-holdover input selector 1902 selects the output data of the aging model calculator 1903 and feeds it back to the input thereof, so that the aging model of the aging model calculator 1903 is updated in accordance with its preceding state in the holdover period.

The input data is subtracted by the filtered output data of the IIRF 1900 in a subtractor 1904 and the subtracted data is fed to an IIRF 1905. The IIRF filtered output data is fed to a locked-mode input selector 1906. The locked-mode input selector 1906 selects update input data and its selected data is fed to a GPS-holdover input selector 1907 which provides selected data, in accordance with a mode, to a temperature model calculator 1908.

In the GPS locked mode, the data selected by the locked-mode input selector 1906 is fed to the temperature model calculator 1908. Also, a temperature sensor 1909 provides the temperature model calculator 1908 with a temperature input data that is in relation to the oscillator and a power supply voltage sensor 1911 provides the temperature model calculator 1908 with a power supply monitor input. The temperature model calculator 1908 calculates Kalman filter function values in accordance with the input data, the temperature input and the power supply voltage input and updates a temperature model thereof, so that the future frequency state of the oscillator is predicted from the updated model.

The temperature model relates the temperature characteristic of the oscillator. In accordance with the updated model, output data is fed from the output of the temperature model calculator 1908 to the locked-mode input selector 1906 and the GPS-holdover input selector 1907. In the event that the temperature model needs to be periodically updated by its preceding state, the locked-mode input selector 1906 selects the output data of the temperature model calculator 1908 as an input data, so that the output data is fed back to the input of the temperature model calculator 1908. The temperature model is updated by the preceding state. In the holdover mode, the input data is unavailable and the GPS-holdover input selector 1907 selects the output data of the temperature model calculator 1908 and feeds it back to the input thereof, so that the temperature model of the temperature model calculator 1908 is updated in accordance with the preceding state in the holdover period.

The output data of the aging model calculator 1903 is added to the initial correction value through the initial offset compensation unit 1912. Both output data from the initial offset compensation unit 1912 and the temperature model calculator 1908 is combined by the adder 1910. The added data is time-delayed by a delay compensation unit 2411 to compensate delays caused by the IIRF 1905 present in the temperature model data path. The output signal from the delay compensation unit 2411 represents predicted frequency element in accordance with the aging, temperature and voltage characteristics. The predicted frequency dependent element is provided to the oscillator, so that the oscillator changes its oscillation frequency in accordance with the predicted frequency element, regardless of the GPS locked mode or the holdover mode. Therefore, the oscillation frequency is controlled in accordance with the models' elements updated by input data in the GPS-mode (a training period) and with the models' elements in the holdover mode, the elements having been updated in the training period.

The algorithm is extendable to any number of frequency perturbing variables. The algorithm can automatically determine the turnover temperature of the crystal oscillator and use this information to enhance tracking during holdover mode. Robust controller tolerance is achieved to variations in oscillator performance. The algorithm is adaptive to any drift pattern. There is no maintenance cost for the embedded algorithm. The algorithm model adaptively scales the order of the control model. Using the algorithm causes cost reduction.

Figure 15:
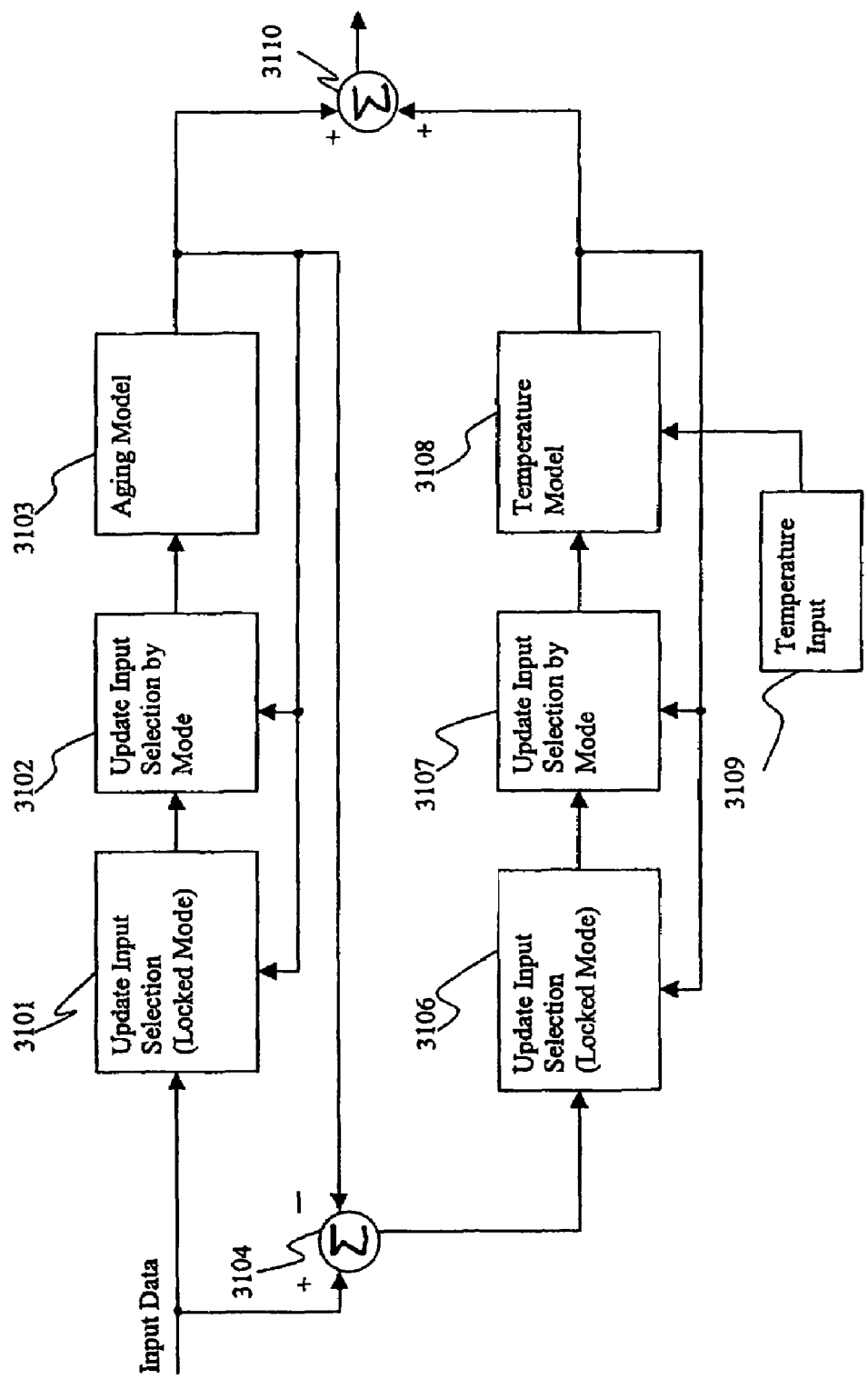
FIG. 15 illustrates the function of blocks of a further embodiment according to the present invention.

FIG. 15 illustrates the function implemented in another embodiment according to the present invention which provides a clock signal in a CDMA base station (not shown). There are two operating modes: GPS locked mode and holdover mode. Referring to FIG. 15, input data of the frequency of an oscillator (not shown) is fed to a locked-mode input selector 3101. The locked-mode input selector 3101 selects update input data and its selected data is fed to a GPS-holdover input selector 3102 which provides data selected in accordance with a mode to an aging model calculator 3103.

In the GPS locked mode, the data selected by the locked-mode input selector 3101 is fed to the aging model calculator 3103 through the GPS-holdover input selector 3102. The aging model calculator 3103 calculates Kalman filter function values in accordance with the input data and updates an aging model thereof, so that the future frequency state of the oscillator is predicted from the updated model. The aging model relates to the aging characteristic of the oscillator. In accordance with the updated model, output data is fed from the output of the aging model calculator 3103 to the locked-mode input selector 3101 and the GPS-holdover input selector 3102. In the event that the aging model needs to be periodically updated by its preceding state, the locked-mode input selector 3101 selects the output data of the aging model calculator 3103 as input data, so that the output data is fed back to the input of the aging model calculator 3103. Accordingly, the aging model is updated by the preceding state.

In the holdover mode, the input data is unavailable and the GPS-holdover input selector 3102 selects the output data of the aging model calculator 3103 and feeds it back to the input thereof, so that the aging model of the aging model calculator 3103 is updated in accordance with its preceding state in the holdover period.

The input data is subtracted by the output data of the aging model calculator 3103 in a subtractor 3104 and the subtracted data is fed to a locked-mode input selector 3106. The locked-mode input selector 3106 selects update input data and its selected data is fed to a GPS-holdover input selector 3107 which provides selected data, in accordance with a mode, to a temperature model calculator 3108.

In the GPS locked mode, the data selected by the locked-mode input selector 3106 is fed to the temperature model calculator 3108 through the GPS-holdover input selector 3107. Also, a temperature sensor 3109 provides the temperature model calculator 3108 with temperature input data that relates to the oscillator. The temperature model calculator 3108 calculates Kalman filter function values in accordance with the input data and updates a temperature model thereof, so that the future frequency state of the oscillator is predicted from the updated model. The temperature model relates to the temperature characteristic of the oscillator. In accordance with the updated model, output data is fed from the output of the temperature model calculator 3108 to the locked-mode input selector 3106 and the GPS-holdover input selector 3107. In the event that the temperature model needs to be periodically updated by its preceding state, the locked-mode input selector 3106 selects the output data of the temperature model calculator 3108 as input data, so that the output data is fed back to the input of the temperature model calculator 3108. The temperature model is updated by the preceding state.

In the holdover mode, the input data is unavailable and the GPS-holdover input selector 3107 selects the output data of the temperature model calculator 3108 and feeds it back to the input thereof, so that the temperature model of the temperature model calculator 3108 is updated in accordance with the preceding state in the holdover period.

The aging model calculator 3103 and the temperature model calculator 3108 update their models adaptively. Such update function is achieved by adaptive algorithm. The Kalman filters are used to perform the adaptive algorithm function, as exampled, in the embodiment.

The output data of the aging model calculator 3103 and the temperature model calculator 3108 is fed to an adder 3110 which provides added data. The added data represents a predicted frequency dependent element in accordance with the aging and temperature characteristics. The predicted frequency element is provided to the oscillator, so that the oscillator changes its oscillation frequency in accordance with the predicted frequency element, regardless of the GPS locked mode or the holdover mode. Therefore, the oscillation frequency is controlled in accordance with the models' elements updated by input data in the GPS-mode (a training period) and with the models' elements in the holdover mode, the elements having been updated in the training period.

Figure 16:
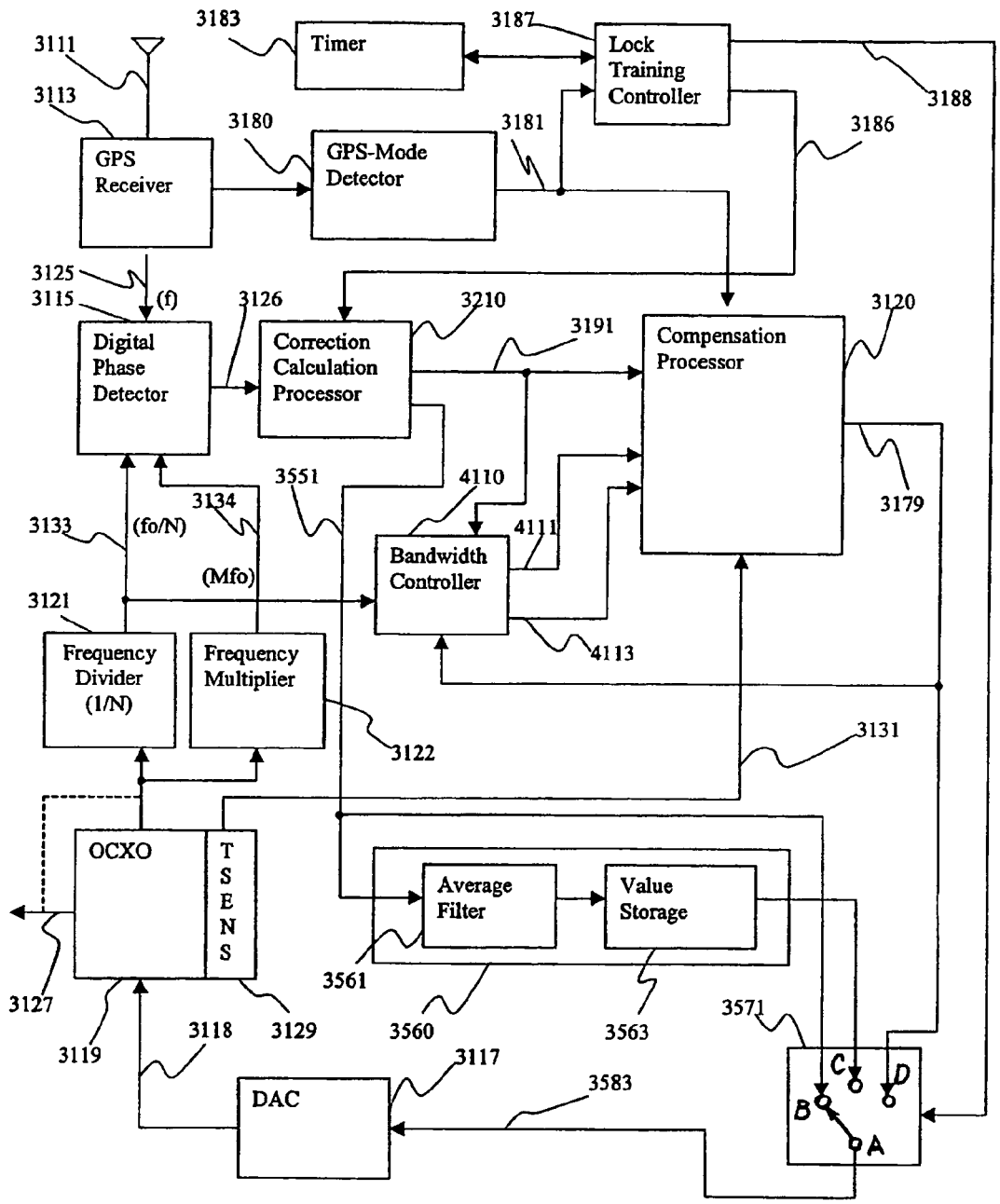
FIG. 16 is a block diagram of a reference timing signal apparatus used in a CDMA base station according to the further embodiment of the present invention.

FIG. 16 shows a reference timing signal apparatus according to another embodiment of the present invention which provides a clock signal in a CDMA base station, for example. The function of each block or unit shown in FIG. 16 corresponds to that of each block shown in FIG. 15.

Figure 17:
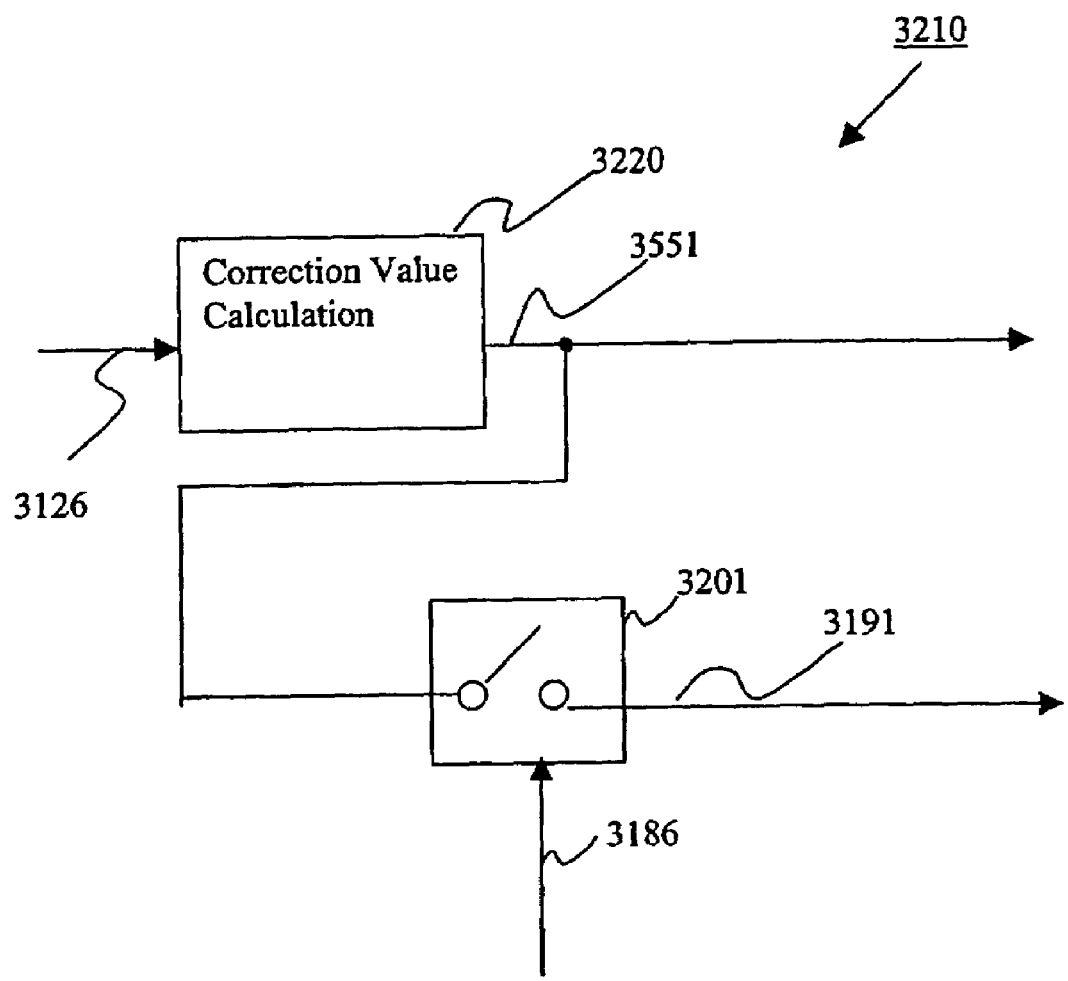
FIG. 17 is a block diagram of a correction calculation processor shown in FIG. 16.

FIG. 17 shows a correction calculation processor shown in FIG. 16. Referring to FIGS. 16 and 17, an antenna 3111 is connected to a GPS receiver 3113. The GPS receiver 3113 is connected to a PLL including a digital phase detector 3115, a digital-to-analog converter (DAC) 3117, an oven-controlled crystal oscillator (OCXO) 3119 and a frequency divider 3121. The reference timing signal apparatus includes a compensation processor 3120 for compensating frequency drift over time and a bandwidth controller 4110 for controlling a tracking bandwidth of the PLL.

A satellite-mode (GPS-mode) detector 3180 connected to the GPS receiver 3113 detects a GPS locked mode and a holdover mode thereof and supplies a mode-switching signal 3181 in accordance with the detected mode. In normal operation (the GPS locked mode), an input reference timing signal 3125 (GPS-generated timing signal) is available from the GPS receiver 3113 and the OCXO 3119 is locked with the input reference timing signal 3125 and a base station reference timing signal 3127 is provided by the reference timing signal apparatus (the OCXO 3119 included in the PLL). In the normal operation, in response to the input reference timing signal 3125 received from the GPS receiver 3113, the PLL closely tracks the GPS-generated timing signal.

During the holdover period (i.e., in the event that the input reference timing signal 3125 is unavailable), the base station reference timing signal 3127 is provided by the OCXO 3119 that had been phase-locked and is self-oscillated. The OCXO 3119 has a temperature sensor (TSENS) 3129 which provides a temperature signal 3131 representing sensed temperature in relation to the OCXO 3119. The compensation processor 3120 compensates frequency drift of the OCXO 3119 over time and in response to the temperature signal 3131.

The digital phase detector 3115 detects the difference in phase between the input reference timing signal 3125 (the GPS-generated timing signal) and the base station reference timing signal 3127 provided by the OCXO 3119 (or a frequency divided output signal 3133 from the frequency divider 3121). A phase detection signal 3126 from the digital phase detector 3115 is fed to a correction value calculator 3220 of a correction calculation processor 3210 that provides a correction value signal 3551. The correction value signal 3551 is fed to terminal "B" of a DAC input selector switch 3571. Under locked mode operation, the DAC input selection switch 3571 is set to connect terminal "A" to terminal "B". The DAC 3117 provides the OCXO 3119 with an analog steering voltage 3118 which is applied at the electronic frequency control (EFC) port of the OCXO 3119, so as to control the oscillation frequency thereof.

The function of the correction value calculator 3220 is similar to that of the correction value calculator 1220 shown in FIG. 3. It operates as shown in FIG. 4.

The correction value signal 3551 is also fed to a delay switch 3201. The delay switch 3201 is switched to the on state by a training initiation signal 3186 provided by a lock training controller 3187 associated with a timer 3183. The timer 3183 provides time for training delay and processor training. The lock training controller 3187 sends a training initiation signal 3186 to a delay switch 3201 for nine hours, for example, after the system to which the reference timing signal apparatus is applied has declared phase lock to the satellite time reference. With the nine-hour delay in application of the correction value signal 3551 to the training the compensation processor 3120 is to ensure that the OCXO has thermally stabilized and the control loop lock transients have decayed to an insignificant level.

Phase lock is indicated via the mode-switching signal 3181 provided by the satellite-mode detector 3180. On activation of the delay switch 3201, the correction value signal 3551 (or a compensation input signal 3191) is applied to the compensation processor 3120. The first two hours, for example, of the application of signal 3551 to compensation processor 3120 is used for training the compensation processor adaptive models with the frequency characteristics of the OCXO 3119 as a function of monitored variables such as time and temperature.

During the training time, the DAC value selection signal 3188 from the lock training controller 3187 ensures that the available DAC input signals are via terminals "B" and "C" of the DAC input selection switch 3571. Whilst the system is locked to the satellite reference signal, the training initiation signal 3186 sets the DAC input selection switch 3571 to connect terminals "A" to "B". In the event that holdover occurs during the two-hour training period of the compensation processor 3120 or during the nine-hour training delay period, the DAC value selection signal 3188 sets the DAC input selection switch 3571 to connect terminals "A" and "C". Terminal "C" of the DAC input selection switch 3571 is connected to a correction value memory 3560.

The correction value signal 3551 is fed to the correction value memory 3560 which includes an average filter 3561 and a value storage 3563. The correction value memory 3560 calculates a 50 point moving average of the correction value signal 3551 by the average filter 3561 and stores the result of the averaging process in the variable at the value storage 3563. A stored value signal 3569 is provided by the value storage 3563.

The correction value store variable represents an average of the most recent 50 correction values, for example, and is used to steer OCXO 3119 in the event that holdover is entered prior to the compensation processor 3120 being fully trained. The OCXO 3119 produces the base station reference timing signal 3127 having a frequency fo which is fed to the frequency divider 3121 having a division factor N. The frequency divided output signal 3133 having a frequency of fo/N is fed to the digital phase detector 3115. A frequency multiplied signal 3134 derived from frequency multiplication of the OCXO's frequency 'fo' by a frequency multiplier 3122 is also fed to the digital phase detector 3115.

Determination of the time difference between the reference signal 3125 and the divided oscillator signal 3133 is achieved using a counter (not shown) included in the digital phase detector 3115 which is started by the rising edge of signal 3133 and stopped by the rising edge of signal 3125 and clocked at a rate set by the frequency multiplied signal 3134. The output of the digital phase detector 3115 is then the time difference between the reference signal 3125 and the divided oscillator signal 3133 in terms of a number of cycles of the frequency multiplied signal 3134 (foxM). The correction calculation processor 3210 converts the phase detector output to a time error through multiplication by the clock period, 1/(foxM).

The phase detect output signal 3126 is fed to the correction value calculator 3220, the output of which is used as the training signal for the compensation processor 3120 to adjust the output voltage applied to the OCXO 3119 through the DAC 3117, so that the phase difference between the input reference timing signal 3125 and the frequency divided output signal 3133 is minimized. This PLL-based feedback circuitry therefore steers the frequency of the OCXO 3119 to provide the base station reference timing signal 3127 having a frequency of fo (=Nf), f being the frequency of the input reference timing signal 3125. The base station reference timing signal 3127 may be obtained from the frequency divider 3121, the frequency of which is fo/N.

The compensation input signal 3191 (taken after the delay switch 3201 is closed), the frequency divided output signal 3133 and the compensation processed signal 3179 are fed to the bandwidth controller 4110 which provides the compensation processor 3120 with an aging bandwidth signal 4111 and a temperature bandwidth signal 4113 for controlling the tracking bandwidth.

Figure 18:
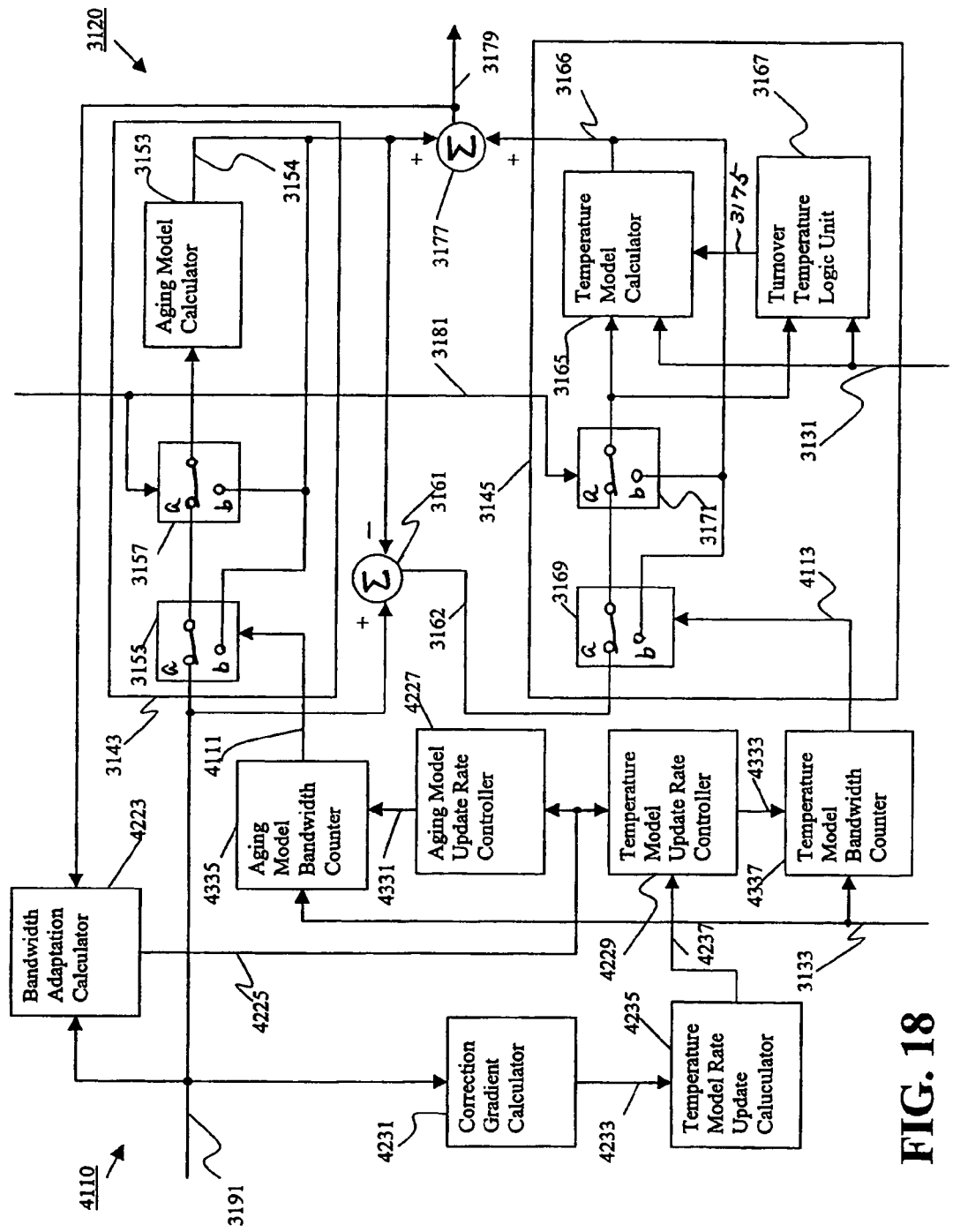
FIG. 18 is a block diagram of a bandwidth controller and a compensation processor shown in FIG. 16.

FIG. 18 shows a detail of the compensation processor 3120 and the bandwidth controller 4110 shown in FIG. 16. Referring to FIGS. 18 and 16, the compensation input signal 3191 is fed to a bandwidth adaptation calculator 4223 of the bandwidth controller 4110. The compensation input signal 3191 occurs in nano seconds every second or equivalently parts per billion of frequency deviation per second. The bandwidth adaptation calculator 4223 also receives the compensation processed signal 3179 from the compensation processor 3120 and provides a bandwidth adaptation signal 4225 to an aging model update rate controller 4227 and a temperature model update rate controller 4229.

The compensation input signal 3191 is also fed to a correction gradient calculator 4231 which provides a gradient signal 4233 to a temperature model rate update calculator 4235. The temperature model rate update calculator 4235 provides a temperature update signal 4237 to the temperature model update rate controller 4229. The aging model update rate controller 4227 and the temperature model update rate controller 4229 provide an aging update control signal 4331 and a temperature update control signal 4333 to an aging model bandwidth counter 4335 and a temperature model bandwidth counter 4337, respectively, in response to the bandwidth adaptation signal 4225.

The frequency divided output signal 3133 having a pulse duration of 1 pps, for example, is fed to the aging model bandwidth counter 4335 and the temperature model bandwidth counter 4337 which provide the aging bandwidth signal 4111 and the temperature bandwidth signal 4113, respectively, to the compensation processor 3120. The aging model bandwidth counter 4335 and the temperature model bandwidth counter 4337 count pulses of the frequency divided output signal 3133.

The compensation input signal 3191 is also fed to the compensation processor 3120. The compensation processor 3120 includes an aging characteristic processing unit 3143, and a temperature characteristic processing unit 3145. When the GPS-generated timing signal is available (i.e., the input reference timing signal 3125 is provided by the GPS receiver 3113), the compensation input signal 3191 is fed to an aging model calculator 3153 through an aging model update switch 3155 and a GPS-holdover mode switch 3157 when both switches are connected to their terminals "a". Each of the aging model update switch 3155 and the GPS-holdover mode switch 3157 has two terminals "a" and "b". The terminals "b" of the both switches are commonly connected to an output terminal of the aging model calculator 3153.

The connection of the GPS-holdover mode switch 3157 is controlled by the mode-switching signal 3181 provided by the satellite-mode detector 3180 in accordance with the availability of the GPS-generated timing signal. The GPS-holdover mode switch 3157 is connected to its terminals "a" and "b", when the GPS-generated timing signal is available and unavailable (i.e., the holdover period), respectively.

The aging bandwidth signal 4111 from the aging model bandwidth counter 4335 is fed to the compensation processor 3120 to control the connections of the aging model update switch 3155 to its terminals "a" and "b" thereof. The aging model update rate controller 4227 determines whether the clock value Clk represented by the frequency divided output signal 3133 is equal to $m_{up} \times \text{Int}$, wherein $m_{up}$ is an update rate for aging model and Int is a predetermined maximum value (an integer). The update rate $m_{up}$ is represented by the bandwidth adaptation signal 4225 provided by the bandwidth adaptation calculator 4223. In a case of Clk being m×Int, under control by the aging model update rate controller 4227, the aging model bandwidth counter 4335 provides the aging bandwidth signal 4111, so that the aging model update switch 3155 is connected to its terminal "a". In a case of Clk not being m×Int, under control by the aging model update rate controller 4227, the aging model bandwidth counter 4335 provides the aging bandwidth signal 4111, so that the aging model update switch 3155 is connected to its terminal "b".

The compensation input signal 3191 and an aging model output signal 3154 of the aging model calculator 3153 are fed to a subtractor 3161, the subtracted signal 3162 of which is fed to a temperature model update switch 3169 of the temperature characteristic processing unit 3145. The subtracted signal 3162 is fed to a temperature model calculator 3165 and a turnover temperature logic unit 3167 of the temperature characteristic processing unit 3145 through an aging model update switch 3169 and a GPS-holdover mode switch 3171 when both switches are connected to their terminals "a". Each of the temperature model update switch 3169 and the GPS-holdover mode switch 3171 has two terminals "a" and "b". The terminals "b" of both switches are commonly connected to an output terminal of the temperature model calculator 3165. The connection of the GPS-holdover mode switch 3171 is controlled by the mode-switching signal 3181. The GPS-holdover mode switch 3171 is connected to its terminals "a" and "b", when the GPS-generated timing signal is available and unavailable, respectively.

The temperature model bandwidth counter 4337 counts the pulses of the frequency divided output signal 3133 in response to the temperature update control signal 4333 from the temperature model update rate controller 4229 and provides the temperature bandwidth signal 4113 to the aging model update switch 3169 of the temperature characteristic processing unit 3145. The temperature bandwidth signal 4113 controls the temperature model update switch 3169 to be connected to its terminal "a" or "b". The temperature model update rate controller 4229 determines whether the clock value Clk represented by the frequency divided output signal 3133 is equal to p×Int, wherein $p_{up}$ is an update rate for temperature model and Int is a predetermined maximum value. The update rate $p_{up}$ is controlled by the bandwidth adaptation calculator 4223 and the temperature model rate update calculator 4235.

In a case of Clk being $p_{up} \times$Int, under control by the temperature model update rate controller 4229, the temperature model bandwidth counter 4337 provides the temperature bandwidth signal 4113, so that the temperature model update switch 3169 is connected to its terminal "a". In a case of Clk not being $p_{up} \times$Int, under control by the temperature model update rate controller 4229, the temperature model bandwidth counter 4337 provides the temperature bandwidth signal 4113, so that the temperature model update switch 3169 is connected to its terminal "b".

The temperature signal 3131 from the temperature sensor 3129 of the OCXO 3119 is fed to the temperature model calculator 3165 and the turnover temperature logic unit 3167. The turnover temperature logic unit 3167 performs temperature calculation in accordance with the oscillator temperature and the subtracted signal 3162 to provide a turnover temperature signal 3175 to the temperature model calculator 3165. In response to the turnover temperature signal 3175, the temperature model calculator 3165 performs temperature model calculation in accordance with the subtracted signal 3162 and the oscillator temperature and provides a temperature model output signal 3166 representing the updated temperature model output value.

The aging model output signal 3154 and the temperature model output signal 3166 are fed to the adder 3177 to provide the compensation processed signal 3179. Under the condition that the DAC input selection switch 3571 connects terminals "A" to "D", the EFC input signal 3118 applied to the OCXO 3119 from the DAC 3117 is controlled by the compensation processed signal 3179. The OCXO 3119 performs oscillation in accordance with the EFC input signal 3118. When the GPS-generated timing signal is available (in the GPS locked mode) the EFC signal 3118 is controlled by the output of the correction calculation processor 3210.

When the GPS-generated timing signal is unavailable, as in holdover, the EFC signal 3118 is controlled by the output of either the correction value memory 3560 or the compensation processor 3120. The control signal applied to DAC 3117 is determined by the DAC input selector switch 3571, the state of which is governed by the lock status of the system and the training status (under control of the lock training controller 3187) of the compensation processor 3120.

Each of the aging model calculator 3153 and the temperature model calculator 3165 includes a Kalman filter as an adaptive filter. The Kalman filter includes a model of the characteristics and provides an error estimate amount as an output. The Kalman filter is known to those skilled in the art. It may comprise a model which performs state estimation, forecasting for oscillator characteristics of frequency aging and temperature. The Kalman filter provides internal estimates of the variances of each of the state estimates. The Kalman filter includes various algorithms necessary to perform prediction error analysis and to estimate the time, frequency, and frequency aging over an initial interval and then forecasts them into the future. The operation of Kalman filter is described in U.S. Pat. No. 5,144,595, which is incorporated herein by reference.

Figure 19:
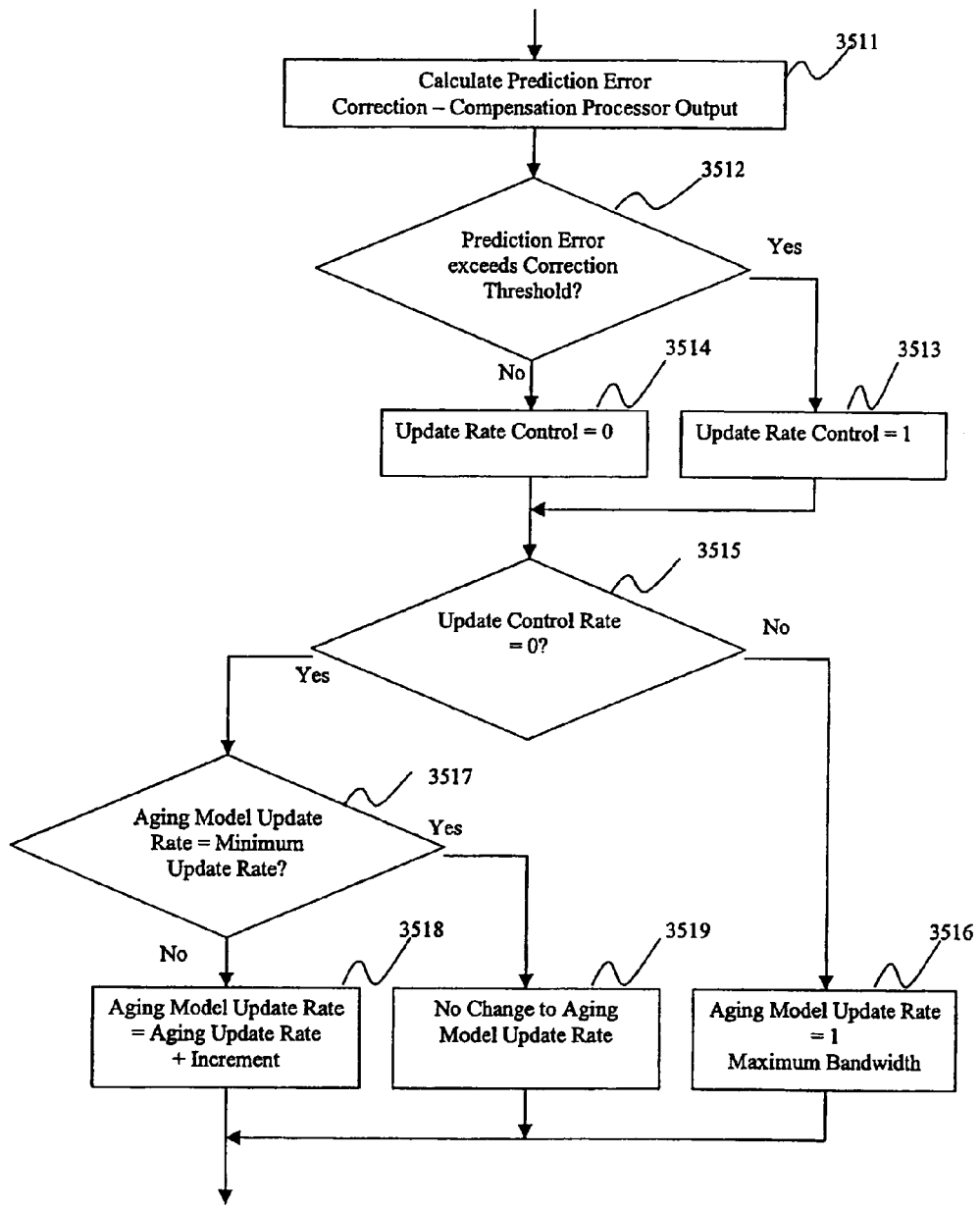
FIG. 19 is a flowchart showing the operation of the bandwidth calculator shown in FIGS. 13 and 14.

FIG. 19 shows the operation of the bandwidth calculator shown in FIGS. 16 and 18. The operation of the adaptive tracking bandwidth compensation algorithm is as follows. Referring to FIGS. 19, 16, 17 and 18, the compensation input signal 3191, as a correction signal to be tracked, is fed to the correction gradient calculator 4231. The rate of change of the correction signal with time is calculated in the correction gradient calculator 4231. The temperature model update rate is calculated in the temperature model rate update calculator 4235 by dividing a user specified tracking error (e.g., 5 ppb) by the correction gradient. If for example a 0.1 ppb tracking error is required and the correction signal gradient is 4.7e−3 ppb/second (40 ppb/70° C., temperature ramp 30° C./hour), then the temperature model must be updated every 21 seconds ($=p_{up}$). The update rate is applied to the temperature model update rate controller 4229. The temperature model update rate controller 4229 uses the output from the temperature model rate update calculator 4235 to set a minimum update rate of the temperature model. The bandwidth adaptation calculator 4223 calculates the difference between the output of the compensation processed signal 3179 and the phase detect output signal 3126 (step 3511).

If the PLL is pulled into the lock or the base station system is recovering from the holdover, then the difference between the output of the compensation processed signal 3179 and the phase detect output signal 3126 is significant. The bandwidth adaptation calculator 4223 contains a threshold level that is defined by a user, e.g., 5 ppb. If the difference between the output of the compensation processed signal 3179 and the phase detect output signal 3126 is equal to or exceeds the threshold (step 3512), then the output of the bandwidth adaptation calculator 4223 is set to "1" (step 3513), otherwise the output is set to "0" (step 3514). If the output of the bandwidth adaptation calculator 4223 is "1", then the temperature model update rate controller 4229 and the aging model update rate controller 4227 set the update rate of the temperature and aging models to unity (negative at step 3515), maximizing the bandwidth of the tracking Kalman filters of the aging model calculator 3153 and the temperature model calculator 3165 (step 3516). The actual update rate to the Kalman filters is generated by the aging model bandwidth counter 4335 and the temperature model bandwidth counter 4337.

The aging model bandwidth counter 4335 and the temperature model bandwidth counter 4337 are clocked by the frequency divided output signal 3133 (the 1 pps signal). Each time the aging model bandwidth counter 4335 and the temperature model bandwidth counter 4337 reach the update rate value, the aging model update switch 3155 and the aging model update switch 3169 allow the adaptive Kalman filters of the aging model calculator 3153 and the temperature model calculator 3165 to be updated. These steps are repeated.

In a case where the difference between the output of the compensation processed signal 3179 and the phase detect output signal 3126 is below the threshold (negative at step 3512), then the output of the bandwidth adaptation calculator 4223 is set to "0" (step 3514).

Once the PLL is settled to a steady value, the bandwidth adaptation signal 4225 of the bandwidth adaptation calculator 4223 falls below the threshold value previously mentioned transitioning bandwidth adaptation signal 4225 from "1" to "0". In a case of the aging model update rate is not a minimum update rate (negative at step 3517), the aging model update rate is incremented (step 3518). The minimum update rate for the aging model and the increment in the aging model update rate are defined by a user. Otherwise, the aging model update rate is not changed (step 3519). The temperature model update rate controller 4229 and the aging model update rate controller 4227 use the bandwidth adaptation signal 4225 to initiate bandwidth reduction of the adaptive Kalman filters of the temperature model calculator 3165 and the aging model calculator 3153.

Steps 3511-3514 are performed by the bandwidth adaptation calculator 4223 and steps 3515-3519 are performed by the aging model update rate controller 4227.

On a second by second basis, the update rates of the Kalman filters of the aging model calculator 3153 and the temperature model calculator 3165 are reduced until the minimum update rates for both adaptive models are reached. In the case of the temperature model, the minimum update rate is provided adaptively by the temperature model rate update calculator 4235. In the case of the aging model, a fixed minimum adaptation rate is used. A fixed minimum update rate may be used in the case of the aging model, because the error in the estimation of the aging process rate is several orders of magnitude lower than in the case of the temperature process rate. A linear adjustment of the update rates with a step adjustment in the bandwidth reduction may be possible.

The embodiment enables the compensation algorithm of the aging model calculator 3153 and the temperature model calculator 3165 to adjust the bandwidth adaptively in order to optimize correction signal tracking whilst rejecting the noise associated with the input signal. The adaptive bandwidth control ensures that abrupt transitions in the correction signal data fed to the compensation processor 3120 can be tracked such that the compensation algorithm is always optimally aligned with the correction signal to be tracked. Without the adaptive bandwidth control, tracking delays will be introduced and thus, the delays must be compensated. The adaptive bandwidth control also makes the algorithm flexible with respect to tracking drift in characteristics of a less stable oscillator.

Figure 20:
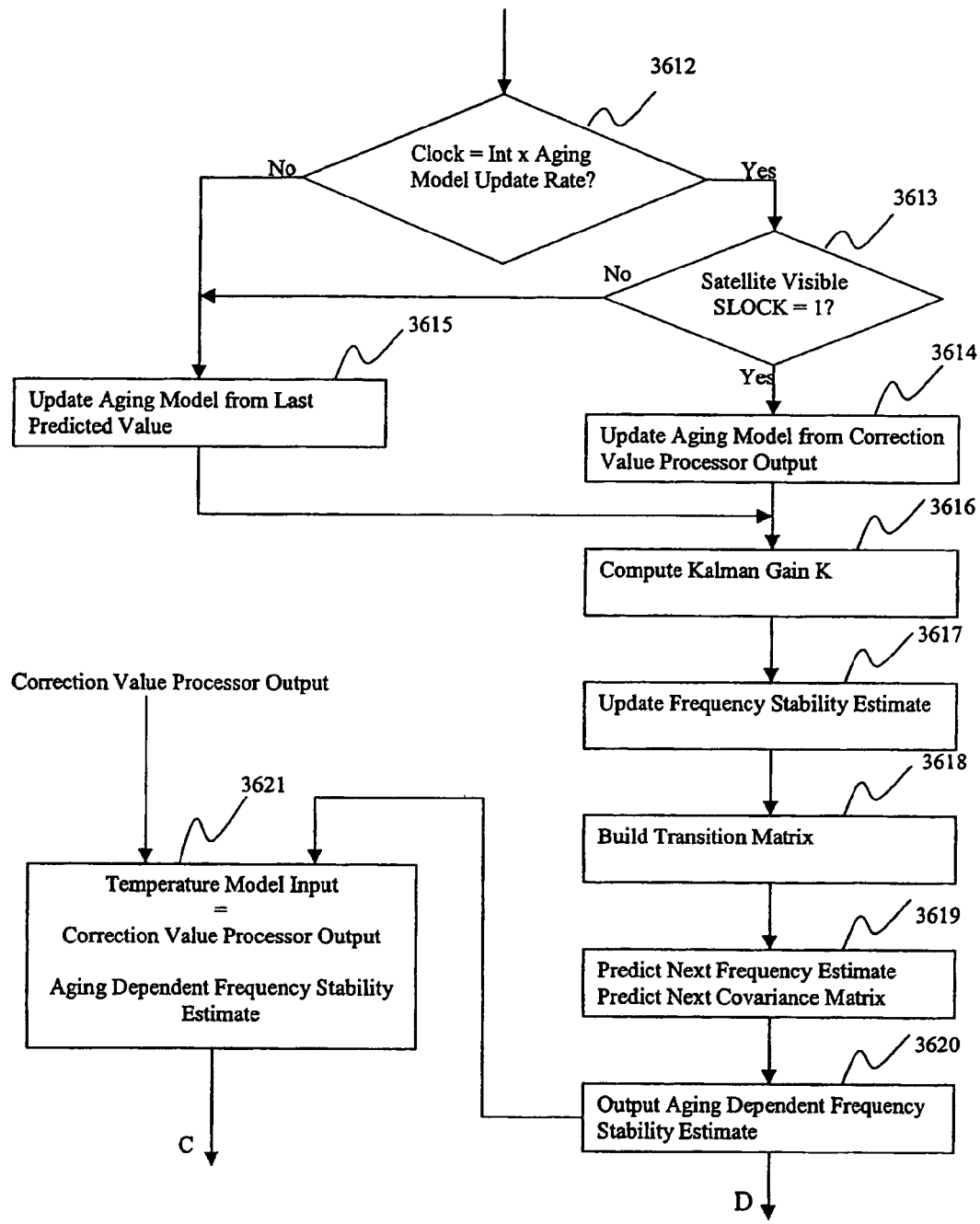
FIG. 20 is a flowchart showing the operation of an aging model calculator in the reference timing signal apparatus shown in FIG. 18.

When the GPS-generated timing signal is available, the PLL including the compensation processor 3120 operates in the GPS locked mode and the aging model calculator 3153 of the aging characteristic processing unit 3143 performs aging dependency frequency stability calculation. FIG. 20 shows operation of the aging compensation calculation. The aging compensation calculation is performed after the operation of the aging model update calculation shown in FIG. 19.

Referring to FIGS. 16, 17, 18 and 20, the GPS-holdover mode switch 3157 of the aging characteristic processing unit 3143 is connected to its terminal "a" for the GPS locked mode, in response to the mode-switching signal 3181. The correction value signal 3551 from the correction value calculator 3220, as a correction signal, is fed to the aging model calculator 3153 which initializes its covariance matrix and frequency stability estimates. The covariance matrix captures the variance of the variants and the covariance of the variants. Variants in the embodiment are the frequency dependence on aging and frequency dependence on temperature. The variance of the variants is captured in the diagonal elements of the covariance matrix. The remaining elements of the matrix capture the covariant terms in the case where the variants are independent such as the present case and so the covariant terms are zero.

The aging model update rate controller 4227 determines whether the clock value Clk represented by the frequency divided output signal 3133, with counting of the clock signal by the aging model bandwidth counter 4335, is equal to m×Int (step 3612), m being the update rate for the aging model (by steps 3516, 3518 and 3519 shown in FIG. 19), Int being the predetermined maximum value at the aging model bandwidth counter 4335 (i.e., Int=1). If Clk is equal to m×Int (positive at step 3612), the switching controller 3159 controls the aging model update switch 3155 to be connected to its terminal "a". In the GPS locked mode, the GPS-holdover mode switch 3157 is connected to its terminal "a" and the phase detect output signal 3126 is fed to the aging model calculator 3153 (positive at step 3613) that updates the aging model in accordance with the data of the phase detect output signal 3126 (step 3614).

If Clk is not equal to m×Int (negative at step 3612), the aging model update switch 3155 is connected to its terminal "b", in response to the aging bandwidth signal 4111. The aging model output signal 3154 from the aging model calculator 3153 is fed back to the aging model calculator 3153 through the aging model update switch 3155 and the GPS-holdover mode switch 3157 and thus, the aging model is updated by the last (or the preceding) predicted value of that aging model (step 3615). Also, in a case of the holdover mode, the aging model output signal 3154 is fed back to the aging model calculator 3153 through the GPS-holdover mode switch 3157. The aging model is updated by the last (or the preceding) predicted value of that aging model (step 3615). After the update of the aging model at step 3614 or 3615, the Kalman gain "K" is computed (step 3616) and the frequency stability estimate is updated (step 3617). The Kalman gain is calculated as blending factor which determines the degree of emphasis to be placed on the next noisy measurement and the prior estimate of the measurement. The Kalman gain is this linear blending factor.

After the computation of the Kalman gain, a transition matrix is built (step 3618). An example of the transition matrix formulation for aging and temperature models is one previously shown as the transition matrix formulation A, with respect to the first embodiment. It is noted that the transition matrix may be expanded to include higher order non linearity terms $\Delta t^3$, $\Delta t^4$, .... However, in this embodiment, the aging and temperature dependent characteristics of the OCXO are well modeled by linear dependencies with appropriate weighting functions.

The transition matrix contains the state update equations which when applied to the current state generate the next predicted state. The next frequency estimate and the next covariance matrix are predicted (step 3619). In accordance with the predicted frequency estimate and covariance matrix, the aging dependent frequency estimate (D) is provided by the aging model calculator 3153 of the aging characteristic processing unit 3143 (step 3620). The aging model output signal 3154 representing the aging dependent frequency estimate and the phase detect output signal 3126 are fed to the subtractor 3161. The subtracted signal 3162 representing the difference between the phase detect output and the aging dependency frequency estimate is provided as a temperature model input (C) to the temperature characteristic processing unit 3145 (step 3621).

Figure 21:
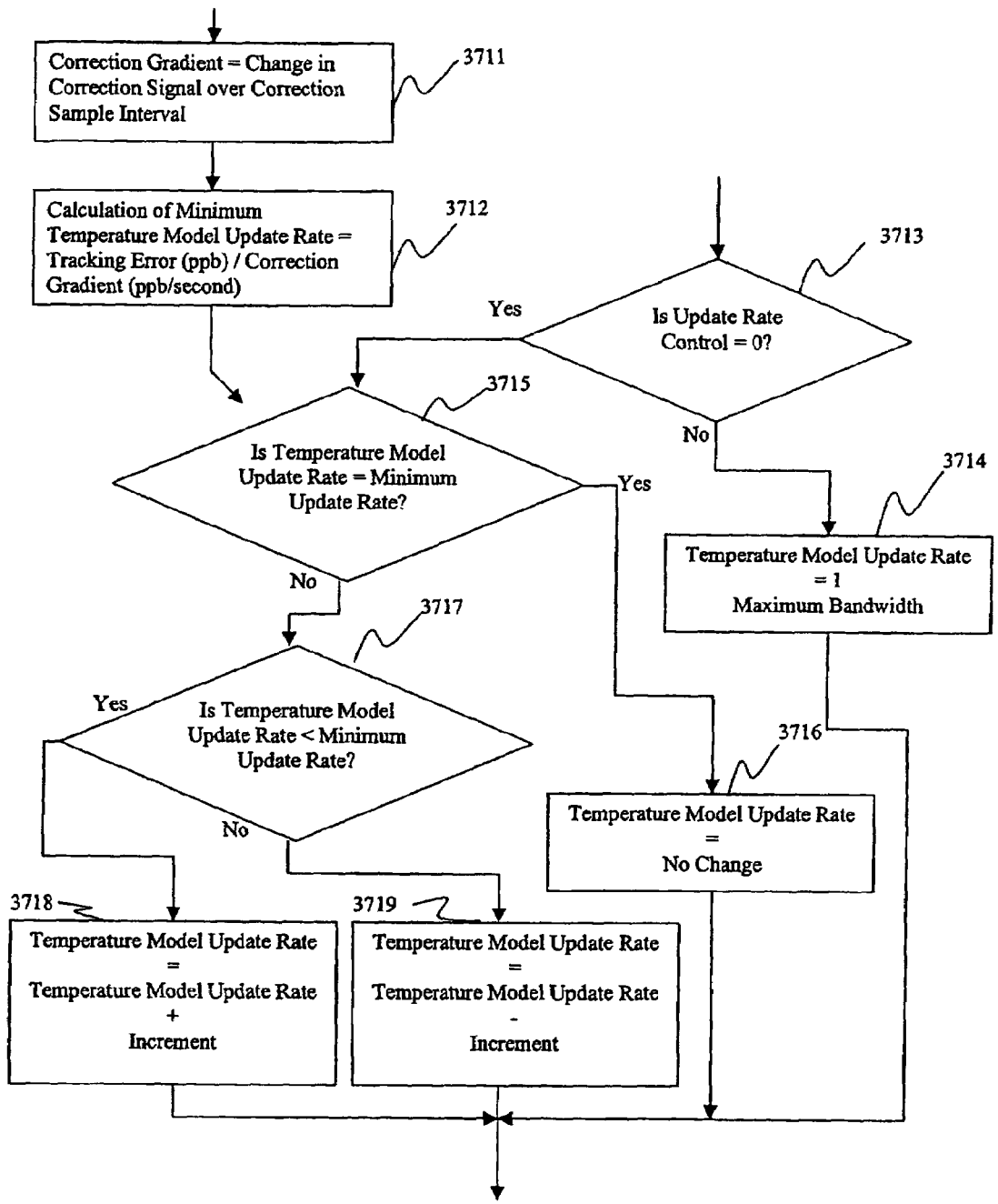
FIG. 21 is a flowchart showing the operation of the temperature model rate update calculator in the reference timing signal apparatus shown in FIG. 18.

FIG. 21 shows the operation of the temperature model rate update calculation. Referring to FIGS. 16, 17, 18 and 21, in response to the correction value signal 3551 from the correction value calculator 3220, the correction gradient calculator 4231 calculates a correction gradient that is a change in the correction value signal 3551, from the correction value calculator 3220, over a correction sample interval of sixty seconds (step 3711). The gradient signal 4233 representing the calculated correction gradient is fed to the temperature model rate update calculator 4235 which in turn calculates a minimum temperature model update rate that is a tracking error (ppb)/the correction gradient (ppb/second) (step 3712). The tracking error is defined by a user (e.g., 0.1 ppb). The temperature update signal 4237 representing the calculated minimum temperature model update rate is fed to the temperature model update rate controller 4229.

The update rate control (the bandwidth adaptation signal 4225) is set to "0" or "1" by the bandwidth adaptation calculator 4223 (steps 3513 and 3514 shown in FIG. 19). The temperature model update rate controller 4229 determines whether the update rate control is "0" (step 3713). If the update rate control is "1" (negative determination), then the temperature model update rate controller 4229 sets the temperature model update rate to "1" that indicates the maximum bandwidth (step 3714). If the update rate control is "0" (positive at step 3713), then it is determined whether the temperature model update rate is the minimum temperature model update rate, which is calculated at step 3712), (step 3715). In a case of positive determination at step 3715, the temperature model update rate is not changed (step 3716). In a case of negative determination at step 3715, it is determined whether the temperature model update rate is smaller than the minimum temperature model update rate (step 3717).

If the temperature model update rate is smaller than the minimum temperature model update rate (positive at step 3717), the temperature model update rate is incremented by an increment amount determined by a user (step 3718). If the temperature model update rate is equal to or greater than the minimum temperature model update rate (negative at step 3717), the temperature model update rate is decremented by a decrement amount determined by the user (step 3719). The temperature update control signal 4333 representing the temperature model update rate set by the temperature model update rate controller 4229 is fed to the temperature model bandwidth counter 4337 that counts the pulses of the frequency divided output signal 3133. The temperature model bandwidth counter 4337 produces the temperature bandwidth signal 4113 for controlling the tracking bandwidth.

In the GPS locked mode, the temperature model calculator 3165 of the temperature characteristic processing unit 3145 performs temperature dependent frequency stability calculation. The temperature model calculator 3165 initializes the covariance matrix and the frequency stability estimate.

Figures 22, 23:
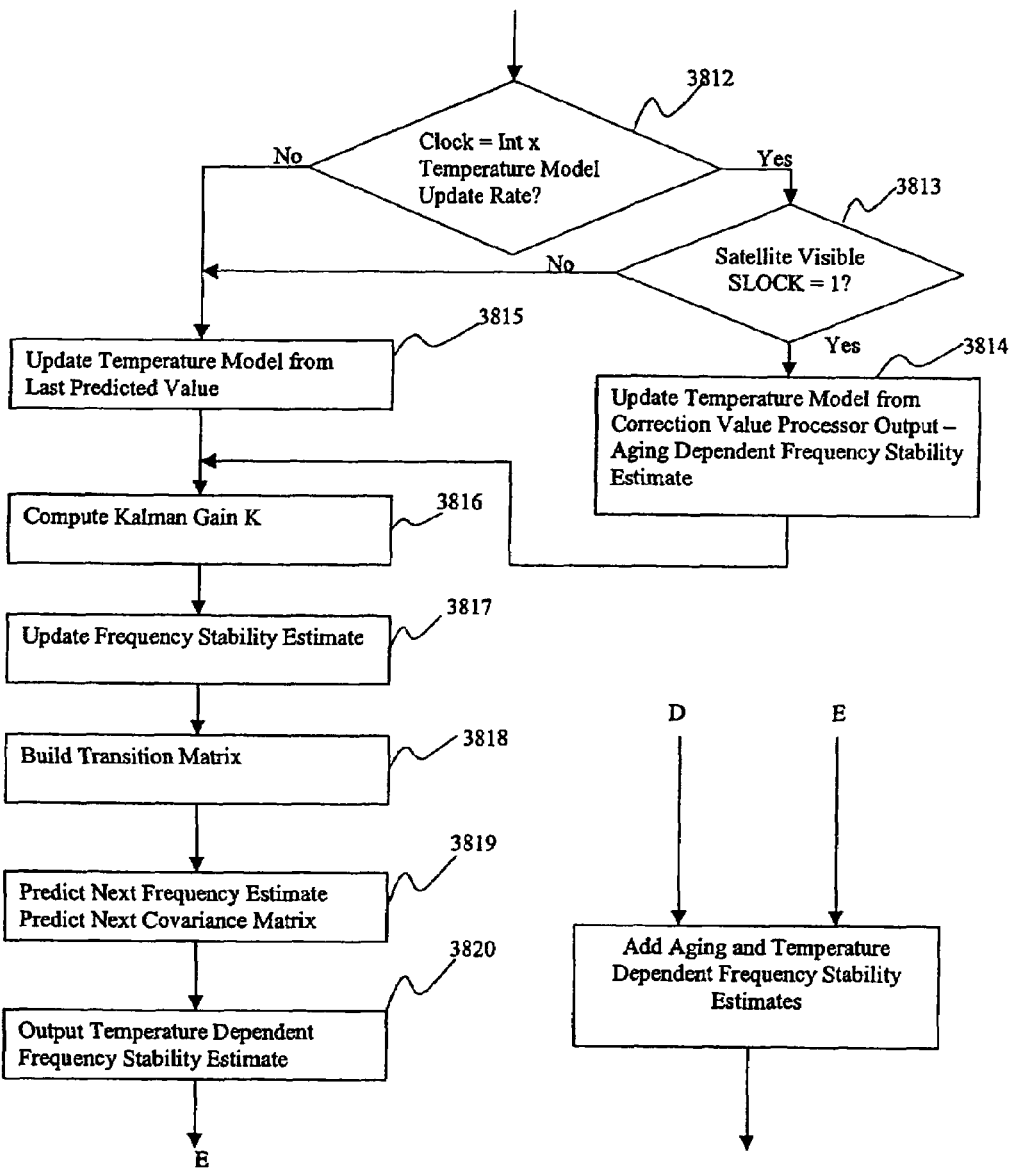
FIG. 22 is a flowchart showing the operation of the temperature model calculator in the reference timing signal apparatus shown in FIGS. 13 and 14.
FIG. 23 illustrates the operation of an adder shown in FIG. 18.

FIG. 22 shows the operation of the temperature model compensation processing. Referring to FIGS. 16, 18 and 22, the temperature characteristic processing unit 3145 receives the temperature model input (C), which is calculated at step 3621 shown in FIG. 20, from the subtractor 3161. Also, the temperature characteristic processing unit 3145 receives the temperature bandwidth signal 4113 from the temperature model bandwidth counter 4337.

The temperature model update rate controller 4229 determines whether the clock value Clk represented by the frequency divided output signal 3133, with counting of the clock signal by the temperature model bandwidth counter 4337, is equal to Int×the temperature model update rate (step 3812), Int being the predetermined maximum value at the temperature model bandwidth counter 4337, the temperature model update rate being one calculated at step 3714, 3716, 3718 or 3719 shown in FIG. 21.

In a case of positive determination at step 3812, the temperature model update switch 3169 is connected to its terminal "a". Then, in a case of the locked mode (positive at step 3813), the GPS-holdover mode switch 3171 is connected to its terminal "a" and the subtracted signal 3162 representing the difference between the phase detect output and the aging dependency frequency estimate is fed to the temperature model calculator 3165. Thus, the temperature model calculator 3165 updates the temperature model in accordance with the phase output signal 3126 (step 3814).

In a case of negative determination at step 3812 and in the holdover mode (negative at step 3813), the temperature model output signal 3166 of the temperature model calculator 3165 is fed back to the input of the temperature model calculator 3165. Thus, the temperature model calculator 3165 updates the temperature model by the last (or the preceding) predicted value (step 3815). After performing step 3814 or step 3815, the temperature model calculator 3165 computes the Kalman gain K (step 3816) and the frequency stability estimate is updated (step 3817).

Thereafter, the transition matrix is built (step 3818) and next frequency estimate and next covariance matrix are predicted (step 3819). The transition matrix is shown above as the transition matrix formulation A. After step 3819, the updated temperature model output is provided by the temperature model calculator 3165 as the temperature model output signal 3166. The temperature model output signal 3166 represents the output temperature dependent frequency stability estimate (E) (step 3820).

The aging model output signal 3154 and the temperature model output signal 3166 are fed to the adder 3177 to be added to provide the compensation processed signal 3179. Thus, the output temperature dependent frequency stability estimate (E) provided at step 3820 and the aging dependent frequency estimate (D) provided at step 3620 shown in FIG. 20 are added as shown in FIG. 23.

Again referring to FIG. 16, in response to the compensation processed signal 3179, the DAC 3117 provides the EFC input signal 3118 in accordance with the output aging dependent frequency stability estimate and the output temperature dependency frequency stability estimate. Thus, the OCXO 3119 is controlled by both the aging and temperature dependent frequency estimates.

In a case of the OCXO 3119 using an SC cut crystal, the frequency (F) vs. temperature (T) characteristic of which is shown in FIG. 9. A turnover temperature logic unit shown in FIG. 8 may be implemented to produce a turnover temperature signal to the temperature model calculator 3165 as the temperature model output signal 3166. A sign included in the turnover temperature signal may be used to build the transition matrix of the temperature model by the temperature model calculator 3165.

Referring to FIGS. 16 and 17, when the base station loses contact with GPS satellite, the GPS-generated timing signal is unavailable to the PLL and the compensation processor 3120. The PLL needs to operate in the holdover mode during the period of lacking of the GPS-generated timing signal, so as to provide the base station reference timing signal 3127. In the holdover mode, the OCXO 3119 operates as a self-oscillator, the frequency of which is controlled by the steering voltage, in accordance with the characteristics of the aging and temperature models of the Kalman filters. In the holdover mode, the GPS-holdover mode switch 3157 of the aging characteristic processing unit 3143 and the GPS-holdover mode switch 3171 of the temperature characteristic processing unit 3145 are connected to their terminals "b". The aging model output signal 3154 of the aging model calculator 3153 is fed back to its input terminal through the GPS-holdover mode switch 3157 and the temperature model output signal 3166 is fed back to its input terminal through the GPS-holdover mode switch 3171.

Figure 24:
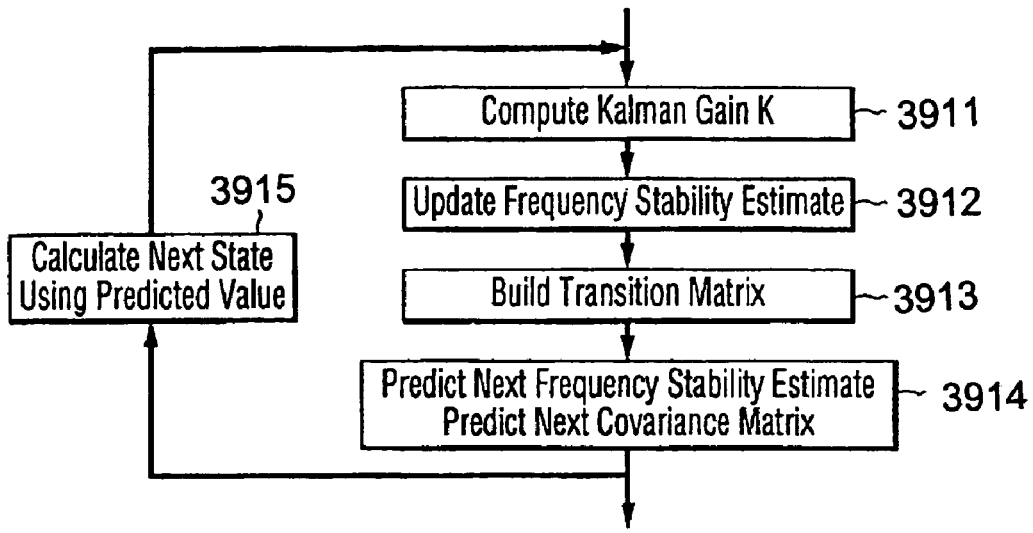
FIG. 24 is a flowchart showing the operation of the aging dependent frequency stability calculator in the holdover mode.

FIG. 24 shows the aging dependent frequency stability calculation in the holdover mode. Referring to FIGS. 16, 18 and 24, the aging model calculator 3153 of the aging characteristic processing unit 3143 uses covariance matrix and frequency stability estimates predicted by using the adaptive algorithm. Prior to the holdover mode, the aging model calculator 3153 sets its covariance matrix and frequency stability estimates, in the GPS locked mode.

The aging model calculator 3153 computes the Kalman gain K (step 3911), updates the frequency stability estimate (step 3912) and builds the transition matrix (step 3913). The transition matrix is shown above as the transition matrix formulation A. The transition matrix contains the state update equations which when applied to the current state generate the next predicted state. The next frequency stability estimate and next covariance matrix are predicted (step 3914). Next state is calculated using the predicted values (step 3915) and steps 3911-3914 are repeated. In accordance with the predicted next frequency stability estimate and covariance matrix, the aging dependent frequency estimate is provided by the aging model calculator 3153. Thus, the aging model calculator 3153 uses the predicted covariance matrix and frequency stability estimates obtained at step 3914. The aging dependent frequency estimate is represented by the aging model output signal 3154 from the aging characteristic processing unit 3143.

Figure 25:
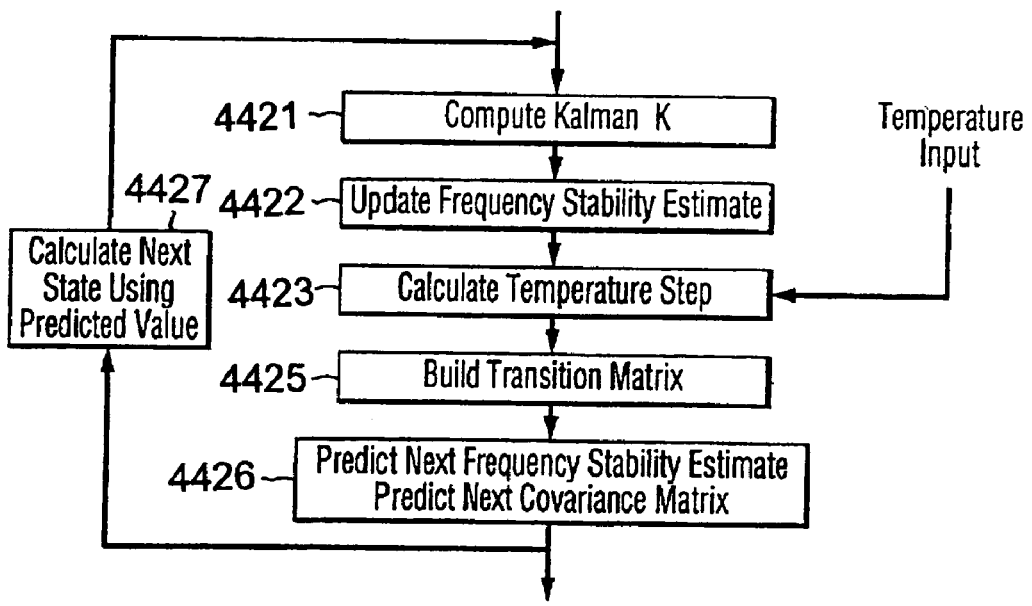
FIG. 25 is a flowchart showing the operation of the temperature dependent frequency stability calculator in the holdover mode.

FIG. 25 shows the temperature dependent frequency stability calculation in the holdover mode. The temperature model calculator 3165 of the temperature characteristic processing unit 3145 uses covariance matrix and frequency stability estimate predicted by using the adaptive algorithm. Prior to the holdover mode, the temperature model calculator 3165 sets its covariance matrix and frequency stability estimates, in the GPS locked mode.

Referring to FIGS. 16, 18 and 25, the temperature model calculator 3165 computes the Kalman gain K (step 4421), and updates the frequency stability estimate (step 4422). The sensed temperature from the temperature sensor 3129 of the OCXO 3119 is fed to the temperature model calculator 3165 by the temperature signal 3131. The temperature model calculator 3165 calculates the temperature step ΔT (step 4423). In response to the calculated temperature, the temperature model calculator 3165 builds the transition matrix (step 4425) and predicts next frequency stability estimate and next covariance matrix (step 4426). Thereafter, the next state is calculated using the predicted values (step 4427) and steps 4421-4426 are repeated. After step 4426 is performed, the temperature dependent frequency estimate is provided. Thus, the temperature model calculator 3165 uses the predicted covariance matrix and frequency stability estimate obtained at step 4426. In accordance with the predicted next frequency stability estimate and covariance matrix, the temperature dependent frequency estimate is provided by the temperature model calculator 3165.

The aging dependent frequency estimate represented by the aging model output signal 3154 from the aging characteristic processing unit 3143 and the temperature dependent frequency estimate represented by the temperature model output signal 3166 from the temperature characteristic processing unit 3145 are fed to the adder 3177. The compensation processed signal 3179 from the adder 3177 includes both the aging and temperature dependent estimates which are provided to the DAC 3117 to control the frequency of the OCXO 3119. Thus, the predicted frequency values generated in accordance with the updated model provide the necessary reference for compensation of the OCXO 3119. In the holdover mode, temperature input values are continuously available to the compensation algorithm and it self-propagates the temperature model to be updated. The updated model is highly accurate as a result of the frequency updates even during the holdover period.

In the embodiment, no IIRFs are used, so that no tracking bandwidth is at the pre-processing stages and no delay compensation processor is necessary after aging and temperature dependencies are estimated. No initial frequency offset is necessary to be recorded. A dynamic or adaptive bandwidth control is implemented. In accordance with the adaptive bandwidth control to the input signal to be tracked, step transitions in the stability variation are tracked. The time required for compensation algorithm is reduced, with the result that training time is reduced. The oscillator outputs of any drift rate can be tracked with the optimal least estimate provided by the Kalman filter, without significant error.

Figure 26:
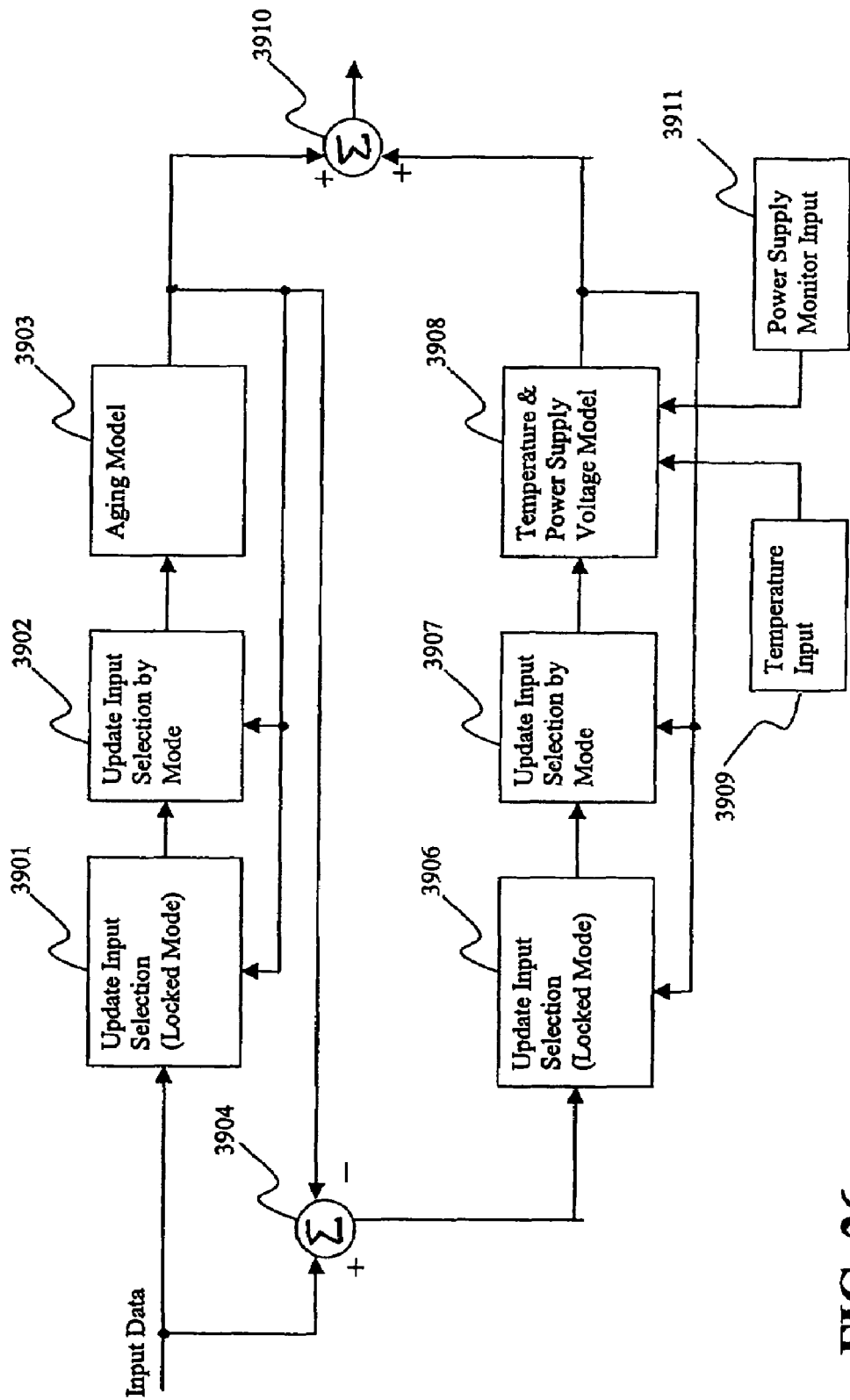
FIG. 26 illustrates the function of another embodiment according to the present invention.

FIG. 26 illustrates the function of another embodiment according to the present invention, wherein the frequency dependent stability of power supply voltage is implemented. The function of each block shown in FIG. 26 corresponds to that of each of block and unit shown in FIG. 15.

Referring to FIG. 26, a raw input data of the frequency of an oscillator (not shown) is fed to a locked-mode input selector 3901. The locked-mode input selector 3901 selects update input data and its selected data is fed to a GPS-holdover input selector 3902 which provides selected data, in accordance with a mode, to an aging model calculator 3903. In the GPS locked mode, the data selected by the locked-mode input selector 3901 is fed to the aging model calculator 3903.

The aging model calculator 3903 calculates Kalman filter function values in accordance with the input data and updates an aging model thereof, so that the future frequency state of the oscillator is predicted from the updated model. The aging model relates to the aging characteristic of the oscillator. In accordance with the updated model, output data is fed from the output of the aging model calculator 3903 to the locked-mode input selector 3901 and the GPS-holdover input selector 3902.

In the event that the aging model needs to be periodically updated by its preceding state, the locked-mode input selector 3901 selects the output data of the aging model calculator 3903 as an input data, so that the output data is fed back to the input of the aging model calculator 3903. Accordingly, the aging model is updated by the preceding state. In the holdover mode, the input data is unavailable and the GPS-holdover input selector 3902 selects the output data of the aging model calculator 3903 and feeds it back to the input thereof, so that the aging model of the aging model calculator 3903 is updated in accordance with its preceding state in the holdover period.

The input data is subtracted by the output data of the aging model calculator 3903 in a subtractor 3904 and the subtracted data is fed to a locked-mode input selector 3906. The locked-mode input selector 3906 selects update input data and its selected data is fed to a GPS-holdover input selector 3907 which provides selected data, in accordance with a mode, to a temperature model calculator 3908.

In the GPS locked mode, the data selected by the locked-mode input selector 3906 is fed to the temperature model calculator 3908. Also, a temperature sensor 3909 provides the temperature model calculator 3908 with a temperature input data that is in relation to the oscillator and a power supply voltage sensor 3911 provides the temperature model calculator 3908 with a power supply monitor input. An example of the power supply voltage sensor 3911 is one shown in FIG. 12.

The temperature model calculator 3908 calculates Kalman filter function values in accordance with the input data, the temperature input and the power supply voltage input and updates a temperature model thereof, so that the future frequency state of the oscillator is predicted from the updated model. The temperature model relates the temperature characteristic of the oscillator. In accordance with the updated model, output data is fed from the output of the temperature model calculator 3908 to the locked-mode input selector 3906 and the GPS-holdover input selector 3907. In the event that the temperature model needs to be periodically updated by its preceding state, the locked-mode input selector 3906 selects the output data of the temperature model calculator 3908 as an input data, so that the output data is fed back to the input of the temperature model calculator 3908. The temperature model is updated by the preceding state.

In the holdover mode, the input data is unavailable and the GPS-holdover input selector 3907 selects the output data of the temperature model calculator 3908 and feeds it back to the input thereof, so that the temperature model of the temperature model calculator 3908 is updated in accordance with the preceding state in the holdover period.

The output data of the aging model calculator 3903 and the temperature model calculator 3908 is fed to an adder 3910 which in turn provides added data. The added data represents predicted frequency element in accordance with the aging, temperature and voltage characteristics. The predicted frequency dependent element is provided to the oscillator, so that the oscillator changes its oscillation frequency in accordance with the predicted frequency element, regardless of the GPS locked mode or the holdover mode. Therefore, the oscillation frequency is controlled in accordance with the models' elements updated by input data in the GPS-mode (a training period) and with the models' elements in the holdover mode, the elements having been updated in the training period.

The algorithm is extendable to any number of frequency perturbing variables. The algorithm may automatically determine the turnover temperature of the crystal oscillator with a turnover temperature calculator as shown in FIG. 8 and use this information to enhance tracking during holdover mode. Robust controller tolerance is achieved to variations in oscillator performance. The algorithm is adaptive to any drift pattern. There is no maintenance cost for the embedded algorithm. The algorithm model adaptively scales the order of the control model. Using the algorithm causes cost reduction in processors, memories and oscillator.

In the above embodiments, the oscillator is a double ovened type and a Kalman filter is used as an adaptive filter in the aging and temperature models for updating their function elements to compensate the frequency dependency characteristics. However, a crystal oscillator without oven-control may be used as an oscillator. Other type of filters, predictors and compensation models may be used. An example of other adaptive filters is an h-infinite filter which may be used for the adaptive algorithm of the aging model calculator and the temperature model calculator, wherein the calculators calculate their filter function values. The reference timing signal apparatus with a PLL may be applicable to any apparatus other than mobile base stations. The algorithm in the embodiments focused on the aging, temperature and voltage frequency dependent characteristics. However, there are other characteristics causing the long term perturbation of the frequency of oscillators.

In the preceding discussion, the embodiments have been described with reference to applications to GPS. It should be evident, however, that these embodiments are equally applicable to other satellite systems, e.g., the Russian Global Navigation Satellite System (GLONASS) positioning system and the European Galileo system. The term "GPS" used in the preceding discussion includes such alternative satellite positioning systems, including the Russian GLONASS system, the European Galileo system and other proposed satellite systems.

Although particular embodiments of the present invention have been described in detail, there are numerous variations. It should be appreciated that numerous variations, modifications, and adaptations may be made without departing from the scope of the present invention as defined in the claims.

What is claimed is:

1. A reference timing signal apparatus for providing a timing output signal, the reference timing signal apparatus comprising:
   an oscillator for generating an oscillation output signal in response to a control component of an input control signal, the oscillator having aging and temperature characteristics resulting in variation in oscillation frequency;
   a difference detector for detecting a difference between the oscillation output signal and an input reference timing signal when the input reference timing signal is available, thereby providing a difference signal;
   a processor for varying the control component of the input control signal applied to the oscillator in accordance with the difference detected by the difference detector and a frequency dependent element relating to the oscillator, the frequency dependent element being provided in accordance with a characteristic model that is updateable in accordance with the difference signal provided by the difference detector when the input reference timing signal is available, a frequency of the oscillation output signal generated by the oscillator being controlled in accordance with the varied control component of the input control signal,
   wherein the processor includes:
      a first pre-processing filter for filtering the difference signal to provide a first filtered output signal;
      a first processing unit for updating a first parameter of a first characteristic model relating to the aging characteristic of the oscillator in response to the first filtered output signal;
      a second pre-processing filter for filtering a combined input signal of the difference signal and the first filtered output signal to provide a second filtered output signal;
      a second processing unit for updating a second parameter of a second characteristic mode relating to the temperature characteristic of the oscillator in response to the second filtered output signal, thereby providing a second processed output signal; and
      a signal combining unit for combining the first and second processed output signals to provide a combined processed signal; and
   a difference processing unit for causing the difference to be offset before being applied to the processor and for compensating the offset of the processor output.

2. The reference timing signal apparatus of claim 1, further including:
   a correction data calculator for calculating correction data based on the difference provided by the difference detector, the correction data being used for a phase-lock of the reference timing signal apparatus.

3. The reference timing signal apparatus of claim 2, wherein the correction data calculator includes:
   a calculator for calculating cumulative time error (CTE) in response to the difference signal, so as to provide error data corresponding to the calculated CTE, the error data being applied to the processor.

4. The reference timing signal apparatus of claim 3, further includes:
   a delay controller for delaying the application of the error data to the processor by a predetermined time.

5. The reference timing signal apparatus of claim 4, wherein the difference processing unit includes:
   an offset applicator for causing the error data to be offset by its initial data before being applied to the processor.

6. The reference timing signal apparatus of claim 5, wherein the difference processing unit further includes:
   a de-offset applicator for compensating the offset caused by the offset applicator with respect to the first processed output signal.

7. The reference timing signal apparatus of claim 6, wherein the offset applicator includes:
   an initial value holder:
      for acquiring an initial value of the error data during a predetermined time period after delay caused by the controller and
      for holding the acquired initial value, thereby providing the held initial value continuously.

8. The reference timing signal apparatus of claim 7, wherein the de-offset applicator includes:
   a signal combiner for combining the offset data and the first processed output signal, the combined signal being applied to the second pre-processing filter.

9. The reference timing signal apparatus of claim 3, further including:
   a storage for storing the error data provided by the calculator, the storage holding the error data, the held error data being continuously provided, the held error data being updated in response to the error data calculated by the calculator.

10. The reference timing signal apparatus of claim 9, further including:
    a selector for selecting the error data provided by the calculator in a first mode, the held error data provided by the storage in a second mode, or the combined processed signal provided by the processor in a third mode to control the oscillator.

11. The reference timing signal apparatus of claim 1, further including:
    a time delay compensation unit for compensating a time delay resulting from data processing of the processor, the time delay compensation unit calculating the time delay in accordance with the second processed output signal.

12. The reference timing signal apparatus of claim 11, wherein the time delay compensation unit includes:
    a calculator for calculating cumulative time error (CTE) in the second processed output signal, the CTE being averaged for a given time period.

13. The reference timing signal apparatus of claim 12, wherein the calculation by the calculator is updated when the input reference timing signal is available, error data corresponding to the averaged CTE being held.

14. The reference timing signal apparatus of claim 13, wherein the time delay compensation unit further includes:
    a combiner for combining the held error data and the output data from the processor to control the oscillator.

15. The reference timing signal apparatus of claim 1, wherein the first and second processing units update the first and second parameters in accordance with the difference signal when the input reference timing signal is available and in accordance with past parameters when the input reference timing signal is unavailable, respectively, and for providing first and second characteristic signals in accordance with the updated parameters of the first and second characteristic models, the control component of the input control signal being varied in accordance with the characteristic signals.

16. The reference timing signal apparatus of claim 15, wherein:
    the first processing unit provides the first characteristic signal in accordance with the first parameter of the first characteristic model and updates the first parameter in accordance with the difference signal when the input reference timing signal is available and in accordance with a past parameter when the input reference timing signal is unavailable, respectively; and
    the second processing unit provides the second characteristic signal in accordance with the second parameter of the second model and updates the second parameter (i) in accordance with the difference signal, the first characteristic signal provided by the first processing unit and a temperature in relation to the oscillator, when the input reference timing signal is available; and (ii) in accordance with a past parameter when the input reference timing signal is unavailable,
    wherein the first and second characteristic signals are combined so as to vary the control component of the input control signal.

17. The reference timing signal apparatus of claim 16, wherein each of the first and second processing units:
    includes an adaptive filter, the first processing unit updating the first parameter of the first model using the adaptive filter thereof, the second processing unit updating the second parameter of the second model using the adaptive filter thereof.

18. A method for providing a timing output signal, comprising the steps of:
    generating an oscillation output signal in response to a control component of an input control signal, the oscillation frequency being varied resulting from aging and temperature characteristics;
    detecting a difference between the oscillation output signal and an input reference timing signal when the input reference timing signal is available, thereby providing a difference signal;
    changing the control component of the input control signal applied to the oscillator in accordance with the difference signal and a frequency dependent element relating to the oscillator;
    providing the frequency dependent element in accordance with first and second characteristic models relating to the aging and temperature characteristics, respectively;
    filtering the difference signal to provide a first pre-processing filtered signal;
    filtering a combined signal of the difference signal and the first pre-processing filtered signal to provide a second pre-processing filtered signal;
    updating the first and second characteristic models in accordance with the first and second pre-processing filtered signals, respectively, when the input reference timing signal is available;
    producing a processed output signal in accordance with the updated first and second characteristic models; and
    compensating a time delay in the processed output signal resulting from the filtering, thereby producing the input control signal,
    wherein a frequency of the oscillation output signal generated by the oscillator is controlled in accordance with the varied control component of the input control signal, the timing output signal being provided in accordance with the oscillation output signal,
    whereby the timing output signal is provided when the input reference timing signal is unavailable.

19. The method of claim 18, further includes the step of:
    causing the difference to be offset before being processed and for compensating the offset of the processed output.

20. A reference timing signal apparatus for providing a timing output signal, the reference timing signal apparatus comprising:

an oscillator for generating an oscillation output signal in response to a control component of an input control signal;

a difference detector for detecting a difference between the oscillation output signal and an input reference timing signal when the input reference timing signal is available, thereby providing a difference signal;

a processor for varying the control component of the input control signal applied to the oscillator in accordance with the difference detected by the difference detector and a frequency dependent element relating to the oscillator, the frequency dependent element being provided in accordance with a characteristic model that is updateable in accordance with the difference signal provided by the difference detector when the input reference timing signal is available, a frequency of the oscillation output signal generated by the oscillator being controlled in accordance with the varied control component of the input control signal; and a controller for controlling a tracking bandwidth of the processor so as to adaptively change the tracking bandwidth in accordance with a loop condition of the reference timing signal apparatus.

21. The reference timing signal apparatus of claim 20, wherein the processor includes:

a first processing unit for providing a first characteristic signal in accordance with a first parameter of a first model, the first parameter relating to an aging characteristic of the oscillator, the first processing unit updating the first parameter in accordance with the difference signal when the input reference timing signal is available and in accordance with a past parameter when the input reference timing signal is unavailable, respectively; and a second processing unit for providing a second characteristic signal in accordance with a second parameter of a second model, the second parameter relating to a temperature characteristic of the oscillator, the second processing unit updating the second parameter (i) in accordance with the difference signal, the first characteristic signal provided by the first processing unit and a temperature in relation to the oscillator, when the input reference timing signal is available; and (ii) in accordance with a past parameter when the input reference timing signal is unavailable, wherein the first and second characteristic signals are combined to produce the characteristic signal, so as to vary the control component of the input control signal.

22. The reference timing signal apparatus of claim 21, wherein:

each of the first and second processing units includes an adaptive filter, the first processing unit updating the first parameter of the first model using the adaptive filter thereof, the second processing unit updating the second parameter of the second model using the adaptive filter thereof.

23. The reference timing signal apparatus of claim 22, wherein the controller includes:

a tracking bandwidth calculator for adaptively calculating the tracking bandwidth in response to the difference signal and the input control signal to provide a dynamically varying bandwidth signal.

24. The reference timing signal apparatus of claim 23, wherein the controller further includes:

an aging update rate controller for controlling the updating of the first characteristic by the first processor, in response to the dynamically varying bandwidth signal.

25. The reference timing signal apparatus of claim 23, wherein the controller further includes:

a temperature update rate controller for controlling the updating of the second characteristic by the second processor, in response to the dynamically varying bandwidth signal.

26. The reference timing signal apparatus of claim 20, further including:

a correction data calculator for calculating correction data based on the difference provided by the difference detector, the correction data being used for phase-lock of the reference timing signal apparatus.

27. The reference timing signal apparatus of claim 26, further includes:

a delay controller for delaying the application of the error data to the processor by a predetermined time.

28. The reference timing signal apparatus of claim 26, wherein the correction data calculator includes:

a calculator for calculating cumulative time error (CTE) in response to the difference signal, error data corresponding to the calculated CTE being applied to the processor.

29. The reference timing signal apparatus of claim 28, further including:

a storage for storing the error data provided by the calculator, the storage holding the error data, the held error data being continuously provided, the held error data being updated in response to the error data calculated by the calculator.

30. The reference timing signal apparatus of claim 29, further including:

a selector for selecting the error data provided by the calculator in a first mode, the held error data provided by the storage in a second mode, or the combined processed signal provided by the processor in a third mode to control the oscillator.

31. A method for providing a timing output signal, comprising the steps of:

generating an oscillation output signal in response to a control component of an input control signal;

detecting a difference between the oscillation output signal and an input reference timing signal when the input reference timing signal is available, thereby providing a difference signal;

changing the control component of the input control signal in accordance with the detected difference and a frequency dependent element relating to the generation;

providing the frequency dependent element in accordance with a characteristic model that is updateable in accordance with the difference signal when the input reference timing signal is available; and adaptively changing a tracking bandwidth for updating the characteristic model, wherein a frequency of the oscillation output signal is controlled in accordance with the varied control component of the input control signal, the timing output signal being provided in accordance with the oscillation output signal, whereby the timing output signal is provided when an input reference timing signal is unavailable.

32. The method of claim 31, wherein the step of providing the frequency dependent element includes the steps of:

providing a first characteristic signal in accordance with a first parameter of a first model, the first parameter relating to an aging characteristic of the generation;

updating the first parameter in accordance with the difference signal when the input reference timing signal is available and in accordance with a past parameter when the input reference timing signal is unavailable, respectively;

providing a second characteristic signal in accordance with a second parameter of a second model, the second parameter relating to a temperature characteristic of the generation;

updating the second parameter:
   (i) in accordance with the difference signal, the first characteristic signal and a temperature in relation to the generation, when the input reference timing signal is available;
   (ii) in accordance with a past parameter when the input reference timing signal is unavailable; and combining the first and second characteristic signals to produce the characteristic signal, so as to vary the control component of the input control signal.

33. The method of claim 32, wherein:
the step of updating the first parameter includes the step of adaptively updating the first parameter of the first model; and
the step of updating the second parameter includes the step of adaptively updating the second parameter of the second model.

34. The method of claim 32, wherein the step of adaptively changing a tracking bandwidth includes the step of:
adaptively calculating the tracking bandwidth in response to the difference signal and the input control signal to provide a dynamically varying bandwidth signal.

35. The method of claim 34, further including the steps of:
controlling the updating of the first characteristic in response to the dynamically varying bandwidth signal; and
controlling the updating of the second characteristic in response to the dynamically varying bandwidth signal.

36. An apparatus for generating a reference signal for use in a cellular base station, the apparatus comprising:
a receiver for generating an input reference timing signal when a cellular signal is available;
an oscillator for generating an oscillation output signal in response to a control component of an input control signal;
a difference detector for detecting a difference between the oscillation output signal and the input reference timing signal when the input reference timing signal is generated, thereby providing a difference signal;
a processor for varying the control component of the input control signal applied to the oscillator in accordance with the difference detected by the difference detector and a frequency dependent element relating to the oscillator, the frequency dependent element being provided in accordance with a characteristic model that is updateable in accordance with the difference signal provided by the difference detector when the input reference timing signal is generated, a frequency of the oscillation output signal generated by the oscillator being controlled in accordance with the varied control component of the input control signal; and
a controller for controlling a tracking bandwidth of the processor so as to adaptively change the tracking bandwidth in accordance with a loop condition of the apparatus.

37. The apparatus of claim 36, wherein the controller includes:
a tracking bandwidth calculator for adaptively calculating the tracking bandwidth in response to the difference signal and the input control signal to provide a dynamically varying bandwidth signal.

38. The apparatus of claim 37, wherein the controller further includes:
an aging update rate controller for controlling the updating of an aging characteristic in response to the dynamically varying bandwidth signal; and
a temperature update rate controller for controlling the updating of a temperature characteristic in response to the dynamically varying bandwidth signal.

* * * * *